(12) United States Patent
Akagi et al.

(10) Patent No.: US 11,822,229 B2
(45) Date of Patent: Nov. 21, 2023

(54) REFLECTIVE MASK BLANK FOR EUV LITHOGRAPHY, MASK BLANK FOR EUV LITHOGRAPHY, AND MANUFACTURING METHODS THEREOF

(71) Applicant: AGC Inc., Tokyo (JP)

(72) Inventors: Daijiro Akagi, Tokyo (JP); Hirotomo Kawahara, Tokyo (JP); Toshiyuki Uno, Tokyo (JP); Ichiro Ishikawa, Tokyo (JP); Kenichi Sasaki, Tokyo (JP)

(73) Assignee: AGC Inc., Tokyo (JP)

( * ) Notice: Subject to any disclaimer, the term of this patent is extended or adjusted under 35 U.S.C. 154(b) by 300 days.

(21) Appl. No.: 17/382,755

(22) Filed: Jul. 22, 2021

(65) Prior Publication Data

US 2022/0035234 A1 Feb. 3, 2022

(30) Foreign Application Priority Data

Jul. 28, 2020 (JP) ................... 2020-127311

(51) Int. Cl.
| | | |
|---|---|---|
| H01L 21/033 | (2006.01) |
| G03F 1/24 | (2012.01) |
| G03F 1/32 | (2012.01) |
| G03F 1/26 | (2012.01) |
| G03F 1/52 | (2012.01) |

(52) U.S. Cl.
CPC .................. G03F 1/24 (2013.01); G03F 1/32 (2013.01); H01L 21/0332 (2013.01); H01L 21/0337 (2013.01)

(58) Field of Classification Search
CPC ... H01L 21/0337; H01L 21/0332; G03F 1/24; G03F 1/26; G03F 1/32; G03F 1/52
See application file for complete search history.

(56) References Cited

U.S. PATENT DOCUMENTS

| | | | |
|---|---|---|---|
| 6,352,803 B1 | 3/2002 | Tong et al. | |
| 2008/0182183 A1* | 7/2008 | Hayashi | .................... G03F 1/58 430/323 |
| 2012/0322000 A1* | 12/2012 | Uno | .......................... G03F 1/24 430/5 |
| 2016/0238924 A1* | 8/2016 | Burkhardt | ................. G03F 1/26 |
| 2019/0049836 A1* | 2/2019 | Hanekawa | ................ G03F 1/52 |

(Continued)

FOREIGN PATENT DOCUMENTS

| | | |
|---|---|---|
| JP | 2003-501823 A | 1/2003 |
| JP | 5282507 B2 | 9/2013 |

(Continued)

*Primary Examiner* — Omar F Mojaddedi
(74) *Attorney, Agent, or Firm* — Oblon, McClelland, Maier & Neustadt, L.L.P.

(57) ABSTRACT

A reflective mask blank for EUV lithography includes: a substrate; a multilayer reflective film for reflecting EUV light; and a phase shift film for shifting a phase of EUV light, the multilayer reflective film and the phase shift film formed on or above the substrate in this order. The phase shift film includes a layer 1 including ruthenium (Ru) and at least one selected from the group consisting of oxygen (O) and nitrogen (N). Among diffraction peaks derived from the phase shift film observed at 2θ: from 20° to 50° by out-of-plane XRD method, a peak having the highest intensity has a half value width FWHM of 1.0° or more.

18 Claims, 3 Drawing Sheets

(56) References Cited

U.S. PATENT DOCUMENTS

| | | | |
|---|---|---|---|
| 2020/0249558 A1* | 8/2020 | Hamamoto | G03F 1/24 |
| 2021/0096456 A1* | 4/2021 | Suzuki | G03F 1/48 |
| 2021/0223681 A1 | 7/2021 | Ikebe et al. | |

FOREIGN PATENT DOCUMENTS

| | | | |
|---|---|---|---|
| JP | 6381921 B2 | 8/2018 | |
| JP | 2021-144075 A | 9/2021 | |
| WO | WO 2019/225736 A1 | 11/2019 | |
| WO | WO 2019/225737 A1 | 11/2019 | |

* cited by examiner

REFLECTIVE MASK BLANK FOR EUV LITHOGRAPHY, MASK BLANK FOR EUV LITHOGRAPHY, AND MANUFACTURING METHODS THEREOF

TECHNICAL FIELD

The present invention relates to a reflective mask blank for EUV (Extreme Ultra Violet) lithography (in the present description, hereinafter referred to as "EUV mask blank") used in semiconductor production, etc., a reflective mask for EUV lithography (in the present description, hereinafter referred to as "EUV mask"), and manufacturing methods thereof.

BACKGROUND ART

Conventionally, in the semiconductor industry, a photolithography method using visible light or ultraviolet light has been employed as a technique for transferring a fine pattern required to form an integrated circuit with a fine pattern on a Si substrate, etc. However, miniaturization of a semiconductor device has been accelerated and, on the other hand, the conventional photolithography method is approaching its limit. In the case of the photolithography method, the resolution limit of a pattern is about ½ of the exposure wavelength. Even if an immersion method is used, the resolution limit is said to be about ¼ of the exposure wavelength, and even if an immersion method with an ArF laser (193 nm) is used, the limit is estimated to be approximately from 20 nm to 30 nm. From this point of view, EUV lithography, which is an exposure technique using EUV light having a wavelength further shorter than ArF laser, is expected to be promising as an exposure technique for 20 nm to 30 nm and generations that follow. In this description, the EUV light indicates a ray having a wavelength in a soft X-ray range or a vacuum ultraviolet range, specifically, a ray having a wavelength of approximately from 10 nm to 20 nm, particularly about 13.5 nm±0.3 nm.

EUV light is readily absorbed by various kinds of substances, and the refractive index of the substance at this wavelength is close to 1. Therefore, a refractive optical system such as conventional photolithography using visible light or ultraviolet light cannot be employed. For this reason, in the EUV lithography, a catoptric system, i.e., a system using a reflective photomask and a mirror, is employed.

On the other hand, apart from shortening the wavelength of light, resolution-enhancing techniques utilizing a phase shift mask have been proposed. In the phase shift mask, a transmission area of a mask pattern is formed using a different substance or shape from an adjacent transmission area to thereby give a 180° phase difference to light having passed through the transmission areas. Consequently, transmitted and diffracted light beams having a 180° phase difference cancel each other in a region between two transmission areas to significantly reduce the light intensity, and in turn, the mask contrast is enhanced. As a result, the focal depth at the time of transfer increases, and the transfer accuracy is improved. The phase difference is best at 180° in principle, but when it is substantially on the order of 175° to 185°, the resolution-enhancing effect is sufficiently obtained.

A halftone mask is a kind of a phase shift mask, and this is a phase shift mask in which with respect to the material constituting the mask pattern, a thin film semi-transmissive to exposure light is used as an absorption layer and a phase difference of approximately from 175° to 185° relative to normal substrate-transmitted light is imparted while attenuating the transmittance to several % (usually, approximately from 2.5% to 15.0% relative to substrate-transmitted light), thereby increasing the resolution in the pattern edge part and enhancing the transfer accuracy.

In the EUV exposure, a catoptric system is used and since the NA (numerical aperture) is small and the wavelength is short, as a specific problem, the exposure is susceptible to unevenness of a mirror or mask surface, making it difficult to resolve a target fine line width with good accuracy. To cope with this difficulty, a halftone EUV mask enabling applying the principle of the halftone mask used in conventional excimer laser exposure, etc. also to EUV exposure using a catoptric system has been proposed (see, for example, Patent Literatures 1 and 2).

In Patent Literatures 1 and 2, a layer containing Ru with a small refractive index n is used as the phase shift film to thereby reduce the film thickness necessary for obtaining a predetermined phase difference, and this renders it possible to form a finer and higher-accuracy phase shift pattern.

However, since RuO described in Patent Literature 1 or Ru described in Patent Literature 2 is a material that is easy to crystallize, a crystal particle may adversely affect the pattern shape when forming a phase shift film pattern. High crystallizability of a material constituting the phase shift film is associated with a problem that, for example, the surface roughness of the phase shift film is large or the line edge roughness (LER) after patterning is large. Therefore, the crystal structure of the phase shift film is preferably amorphous.

Then, in Patent Literature 3, a material containing Ru and a predetermined element is used for the phase shift film to render the crystal structure of the phase shift film amorphous, and it is stated that adverse effect of a crystal particle of a metal, etc. when forming a phase shift pattern can thereby be reduced.

Patent Literature 1: Japanese Patent No. 5,282,507
Patent Literature 2: Japanese Patent No. 6,381,921
Patent Literature 3: International Publication WO2019/225736

SUMMARY OF INVENTION

However, it has been found that even when a material containing Ru and a predetermined element is used for the phase shift film according to the invention described in Patent Literature 3, the crystal structure of the phase shift film does not become amorphous in some cases.

For solving the above-described problems of background arts, an object of the present invention is to provide an EUV mask blank including a phase shift film with the crystal structure being amorphous.

The present invention provides the following [1] to [18].
[1] A reflective mask blank for EUV lithography, including: a substrate; a multilayer reflective film for reflecting EUV light; and a phase shift film for shifting a phase of EUV light, the multilayer reflective film and the phase shift film formed on or above the substrate in this order, wherein the phase shift film includes a layer 1 including ruthenium (Ru) and at least one selected from the group consisting of oxygen (O) and nitrogen (N), and wherein among diffraction peaks derived from the phase shift film observed at 2θ: from 20° to 50° by out-of-plane XRD method, a peak having the highest intensity has a half value width FWHM of 1.0° or more
[2] The reflective mask blank for EUV lithography according to [1], wherein the layer 1 includes from 40 to 99 at % of Ru and from 1 to 60 at % of O, or includes from 30 to 98 at % of Ru, from 1 to 69 at % of O, and from 1 to 69 at % of N.

[3] The reflective mask blank for EUV lithography according to [1], wherein the layer 1 includes from 30 to 98 at % of Ru and from 2 to 70 at % of N.

[4] The reflective mask blank for EUV lithography according to [2], wherein the layer 1 further includes at least one element (X) selected from the group consisting of chromium (Cr), tantalum (Ta), titanium (Ti), rhenium (Re), tungsten (W), bismuth (Bi), manganese (Mn), platinum (Pt), copper (Cu), iridium (Ir), and vanadium (V) in a range of 20:1 to 1:5 in terms of a composition ratio (at %) (Ru:X) of Ru to X, and wherein the layer 1 includes from 40 to 99 at % of a total (Ru+X) of Ru and X and from 1 to 60 at % of O, or includes 30 to 98 at % of a total (Ru+X) of Ru and X, from 1 to 69 at % of O, and from 1 to 69 at % of N.

[5] The reflective mask blank for EUV lithography according to [3], wherein the layer 1 further includes at least one element (X) selected from the group consisting of Cr, Ta, Ti, Re, W, Bi, Mn, Pt, Cu, Ir, and V in a range of 20:1 to 1:5 in terms of a composition ratio (at %) (Ru:X) of Ru to X, and wherein the layer 1 comprises from 30 to 90 at % of a total (Ru+X) of Ru and X and from 10 to 70 at % of N.

[6] The reflective mask blank for EUV lithography according to [1] to [5], wherein the phase shift film further includes a layer 2 including at least one element (X) selected from the group consisting of Cr, Ta, Ti, Re, W, Bi, Mn, Pt, Cu, Ir, and V.

[7] The reflective mask blank for EUV lithography according to [6], wherein the layer 2 further includes at least one element selected from the group consisting of O, N, boron (B), and carbon (C).

[8] The reflective mask blank for EUV lithography according to [1] to [7], wherein the phase shift film has a thickness of from 20 nm to 60 nm. [9] The reflective mask blank for EUV lithography according to [1] to [8], wherein the layer 1 has a thickness of 10 nm or more.

[10] The reflective mask blank for EUV lithography according to [1] to [9], wherein a phase difference between a reflected light of EUV light from the multilayer reflective film and a reflected light of EUV light from the phase shift film is from 150° to 250°, and wherein a relative reflectance between an EUV light ray reflectance on a surface of the phase shift film and an EUV light ray reflectance on a surface of the multilayer reflective film ((EUV light ray reflectance on phase shift film surface/EUV light ray reflectance on multilayer reflective film surface)×100) is from 2% to 37%.

[11] The reflective mask blank for EUV lithography according to [1] to [10], including a protective film for the multilayer reflective film formed between the multilayer reflective film and the phase shift film.

[12] The reflective mask blank for EUV lithography according to [11], wherein the protective film comprises at least one element selected from the group consisting of Ru, palladium (Pd), Ir, rhodium (Rh), Pt, zirconium (Zr), niobium (Nb), Ta, Ti, and silicon (Si).

[13] The reflective mask blank for EUV lithography according to [12], wherein the protective film further includes at least one element selected from the group consisting of O, N, and B.

[14] The reflective mask blank for EUV lithography according to [1] to [13], wherein the etching mask film comprises at least one element selected from the group consisting of Nb, Ti, molybdenum (Mo), Ta, and Si.

[15] The reflective mask blank for EUV lithography according to [14], wherein the etching mask film further includes at least one element selected from the group consisting of O, N, and B.

[16] A reflective mask for EUV lithography, obtained by forming a pattern in the phase shift film of the reflective mask blank for EUV lithography according to [1] to [15].

[17] A method for manufacturing a reflective mask blank for EUV lithography, including: a step of forming, on a substrate, a multilayer reflective film for reflecting EUV light; a step of forming, on the multilayer reflective film, a phase shift film for shifting a phase of EUV light; and a step of forming an etching mask film on the phase shift film, wherein the phase shift film includes a layer 1 including ruthenium (Ru) and at least one selected from the group consisting of oxygen (O) and nitrogen (N), wherein among diffraction peaks derived from the phase shift film observed at 2θ: from 20° to 50° by out-of-plane XRD method, a peak having a highest intensity has a half value width FWHM of 1.0° or more, and wherein the etching mask film is removable by cleaning with an acid or a base.

[18] A method for manufacturing a reflective mask for EUV lithography, including forming a pattern by patterning the phase shift film in the reflective mask blank for EUV lithography manufactured by the manufacturing method of a reflective mask blank for EUV lithography according to [17].

The EUV mask blank of the present invention includes a phase shift mask with the crystal structure being amorphous.

DESCRIPTION OF EMBODIMENTS

Figure 1:
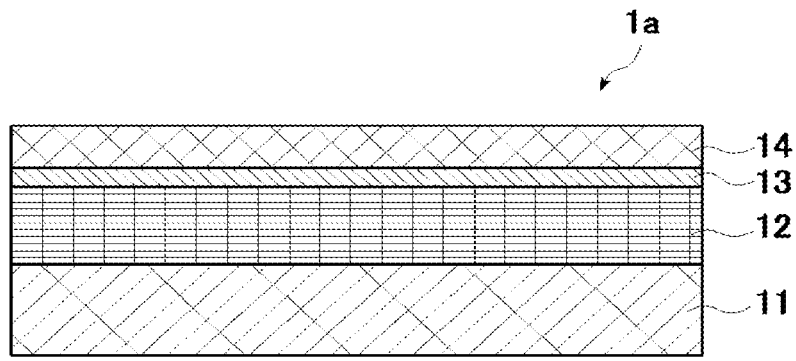
FIG. 1 is a schematic cross-sectional diagram illustrating one embodiment of the EUV mask blank of the present invention.

The EUV mask blank of the present invention and the EUV mask of the present invention are described below by referring to the drawings.

FIG. 1 is a schematic cross-sectional diagram illustrating one embodiment of the EUV mask blank of the present invention. In the EUV mask blank 1a illustrated in FIG. 1, a multilayer reflective film 12 for reflecting EUV light, a protective film 13 for the multilayer reflective film 12, and a phase shift film 14 for shifting the phase of EUV light are formed in this order on or above a substrate 11 from the substrate side. Here, in the configuration illustrated in FIG. 1 of the EUV mask blank of the present invention, only the substrate 11, the multilayer reflective film 12, and the phase shift film 14 are essential, and the protective film 13 is an optional constituent element.

The protective film 13 for the multilayer reflective film 12 is a layer provided with the purpose of protecting the multilayer reflective film 12 at the time of forming a pattern on the phase shift film 14.

Respective constituent elements of the EUV mask blank 1a are described below.

The substrate 11 satisfies the properties as a substrate for the EUV mask blank. Therefore, the substrate 11 has a low coefficient of thermal expansion (specifically, the coefficient of thermal expansion at 20° C. is preferably $0±0.05×10^{-7}/°$ C., more preferably $0±0.03×10^{-7}/°$ C.) and is excellent in smoothness, flatness and resistance to a cleaning liquid used for cleaning, etc. of a mask blank or a photomask after pattern formation. As the substrate 11, specifically, a glass having a low coefficient of thermal expansion, for example, a $SiO_2$—$TiO_2$ glass, is used, but the present invention is not limited thereto, and a substrate such as crystallized glass precipitated with β-quartz solid solution, silica glass, silicon, metal, etc. can also be used.

The substrate 11 preferably has a smooth surface with a surface roughness (RMS) of 0.15 nm or less and a flatness of 100 nm or less, because high reflectance and transfer accuracy are obtained in a photomask after pattern formation.

The size, thickness, etc. of the substrate 11 are appropriately determined according to designed values, etc. of the mask. In Examples described later, a $SiO_2$—$TiO_2$ glass having an outer dimension of 6 inch (152 mm) square and a thickness of 0.25 inch (6.3 mm) was used.

It is preferred that no defect exists in the surface of the substrate 11 on which the multilayer reflective film 12 is formed. However, a defect may exist as long as a phase defect is not generated due to a concave defect and/or a convex defect. Specifically, it is preferred that the depth of a concave defect and the height of a convex defect are 2 nm or less and the half value widths of these concave and convex defects are 60 nm or less. The half value width of the concave defect indicates a width at a position of ½ of the depth of the concave defect. The half value width of the convex defect indicates a width at a position of ½ of the height of the convex defect.

The multilayer reflective film 12 achieves a high EUV light ray reflectance by alternately stacking a high-refractive-index layer and a low-refractive-index layer a plurality of times. In the multilayer reflective film 12, Mo is widely used for the high-refractive-index layer, and Si is widely used for the low-refractive-index layer. That is, a Mo/Si multilayer reflective film is most common. However, the multilayer reflective film is not limited thereto, and a Ru/Si multilayer reflective film, a Mo/Be multilayer reflective film, a Mo compound/Si compound multilayer reflective film, a Si/Mo/Ru multilayer reflective film, a Si/Mo/Ru/Mo multilayer reflective film, and a Si/Ru/Mo/Ru multilayer reflective film may also be used.

The multilayer reflective film 12 is not particularly limited as long as it has desired properties as a reflective layer of the EUV mask blank. Here, the property particularly required for the multilayer reflective film 12 is a high EUV light ray reflectance. Specifically, when the multilayer reflective film 12 surface is irradiated with light rays in a wavelength range of EUV light at an incident angle of 6°, the maximum value of the reflectance for light ray having a wavelength of around 13.5 nm is preferably 60% or more, more preferably 65% or more. Also, even in the case of providing a protective film 13 on the multilayer reflective film 12, the maximum value of the reflectance for light ray having a wavelength of 13.5 nm is preferably 60% or more, more preferably 65% or more.

The film thickness of each layer constituting the multilayer reflective film 12 and the number of repeating layer units can be appropriately selected according to film materials used and the EUV light ray reflectance required for the reflective layer. Taking a Mo/Si multilayer reflective film as an example, in order to form a multilayer reflective film 12 having a maximum value of EUV light ray reflectance of 60% or more, the multilayer reflective film may be formed by stacking a Mo layer with a film thickness of 2.3±0.1 nm and a Si layer with a film thickness 4.5±0.1 nm such that the number of repeating units becomes from 30 to 60.

Each layer constituting the multilayer reflective film 12 may be film-deposited to a desired thickness by use of a known deposition method such as magnetron sputtering method or ion beam sputtering method. For example, in the case of forming a Si/Mo multilayer reflective film by use of an ion beam sputtering method, it is preferred that a Si film is deposited at an ion accelerating voltage of 300 V to 1,500 V and a deposition rate of 0.030 nm/sec to 0.300 nm/sec to have a thickness of 4.5 nm by using a Si target as the target and an Ar gas (gas pressure: from $1.3×10^{-2}$ Pa to $2.7×10^{-2}$ Pa) as the sputtering gas and subsequently, a Mo film is deposited at an ion accelerating voltage of 300 V to 1,500 V and a deposition rate of 0.030 nm/sec to 0.300 nm/sec to have a thickness of 2.3 nm by using a Mo target as the target and an Ar gas (gas pressure: from $1.3×10^{-2}$ Pa to $2.7×10^{-2}$ Pa) as the sputtering gas. Taking these operations as one cycle, the Si film and the Mo film are stacked in 40 cycles to 50 cycles, and a Si/Mo multilayer reflective film is thereby deposited.

In order to prevent oxidation of the multilayer reflective film 12 surface, the uppermost layer of the multilayer reflective film 12 is preferably a layer formed of a material resistant to oxidation. The layer formed of a material resistant to oxidation functions as a cap layer for the multilayer reflective film 12. Specific examples of the layer formed of a material resistant to oxidation and functioning as a cap layer include a Si layer. In the case where the multilayer reflective film 12 is a Si/Mo multilayer reflective film, when the uppermost layer is a Si layer, the uppermost layer functions as a cap layer. In this case, the film thickness of the cap layer is preferably 11±2 nm.

The protective film 13 is provided for the purpose of protecting the multilayer reflective film 12 so that the multilayer reflective film 12 is not damaged in an etching process at the time of forming a pattern in the phase shift film 14 by an etching process, usually by a dry etching process. Accordingly, as the material of the protective film, a material which is less affected by the etching process of the phase shift film 14, i.e., which has an etching rate lower than that of the phase shift film 14 and is less likely damaged by the etching process, is selected. In order to satisfy these properties, the protective film 13 contains at least one element selected from the group consisting of Ru, Pt, Pd, Ir, Rh, Zr, Nb, Ta, Ti and Si. However, Ru is also a constituent material of the phase shift film 14 and therefore, in the case of using Ru as the material of the protective film 13, an alloy with another element is used. Specific examples thereof include RuZr.

The protective film 13 may further contain at least one element selected from the group consisting of O, N and B, that is, may be an oxide, a nitride, an oxynitride, or a boride of the element above. Specific examples thereof include $ZrO_2$ and $SiO_2$.

The thickness of the protective film 13 is not particularly limited but in the case of a RuZr film, the thickness is preferably from 2 nm to 3 nm.

The protective film 13 is deposited using a known deposition method such as magnetron sputtering method or ion beam sputtering method. In the case of forming a RuZr film by a DC sputtering method, the film is preferably deposited at a deposition rate of 0.020 nm/sec to 1.000 nm/sec to have a thickness of 2 nm to 3 nm by using a Ru target and a Zr target as the target and an Ar gas (gas pressure: $1.0 \times 10^{-2}$ Pa or more and $1.0 \times 10^{0}$ Pa or less) as the sputtering gas while setting the input power to each of the Ru target and the Zr target to be 100 W or more and 600 W or less.

As described above, the crystal structure of the phase shift film in the halftone EUV mask is required to be amorphous.

In the EUV mask blank 1a of the present invention, the phase shift film 14 has a layer 1 containing Ru and at least one selected from the group consisting of O and N.

In the EUV mask blank 1a of the present invention, because the phase shift film 14 has the layer 1, among diffraction peaks derived from the phase shift film 14 observed at 2θ: from 20° to 50° by out-of-plane XRD method, the half value width FWHM of a peak having the highest intensity (in the present description, hereinafter, referred to as half value width FWHM) is 1.0° or more. When the half value width FWHM is 1.0° or more, a sharp peak derived from a crystalline phase is not observed, and the crystal structure of the phase shift film 14 is amorphous.

In the case where the phase shift film 14 is composed of only the layer 1, the crystal structure of the phase shift film 14 forming the layer 1 is amorphous. In the case where the phase shift film 14 has the later-described layer 2, the crystal structure of the entire phase shift film 14 including the layer 1 and the layer 2 is amorphous.

In the case where a diffraction peak derived from the phase shift film is not observed at 2θ: from 20° to 50° by out-of-plane XRD method, the half value width FWHM is 180°.

When the crystal structure of the phase shift film 14 is amorphous, the smoothness of the phase shift film 14 surface increases.

In the present description, a surface roughness (RMS) of the phase shift film 14 surface measured using an Atomic Force Microscope is used as an indicator of the smoothness of the phase shift film 14 surface.

In the EUV mask blank 1a of the present invention, the surface roughness (RMS) of the phase shift film 14 surface is preferably 0.3 nm or less, more preferably 0.25 nm or less.

In the phase shift film 14 of the present invention, the half value width FWHM is preferably 2.0° or more, more preferably 3.0° or more. The phase shift film 14 of the present invention is preferably in a state where no peak is observed. In addition, the half value width FWHM is preferably 5.0° or less, more preferably 3.5° or less.

In the EUV mask blank 1a of the present invention, when the phase shift film 14 is in the following first to third embodiments, the half value width FWHM is 1.0° or more.

First Embodiment

The first embodiment of the phase shift film 14 has a layer 1 containing from 40 to 99 at % of Ru and from 1 to 60 at % of O.

If the O content of the layer 1 is less than 1 at %, in the measurement by out-of-plane XRD method, a sharp peak derived from a crystalline phase of Ru is observed among diffraction peaks derived from the phase shift film 14 observed at 2θ: from 20° to 50°, and the half value width FWHM becomes less than 1.0°.

If the O content of the layer 1 is more than 60 at %, a sharp peak derived from a crystalline phase of $RuO_2$ is observed among diffraction peaks derived from the phase shift film 14 observed at 2θ: from 20° to 50°, and the half value width FWHM becomes less than 1.0°.

When the O content of the layer 1 is from 1 to 60 at %, in the measurement by out-of-plane XRD method, a sharp peak derived from a crystalline phase of Ru or a crystalline phase of $RuO_2$ is not observed among diffraction peaks derived from the phase shift film 14 observed at 2θ: from 20° to 50°, and the half value width FWHM becomes 1.0° or more.

In the present description, the content of each element in the layer 1 and the later-described layer 2 of the phase shift film is a value measured by an X-ray photoelectric spectrometer.

At the time of forming the phase shift film by using a sputtering method according to the procedure described later, O sometimes intrudes, but the O content due to such intrusion is less than 1.0 at %, and the half value width FWHM does not become 1.0° or more.

In the first embodiment of the phase shift film 14, the optical constant of the layer 1 changes due to introduction of O and therefore, the EUV light ray reflectance on the phase shift film surface can be adjusted by controlling the O content in the layer 1.

The first embodiment of the phase shift film 14 preferably has a layer 1 containing from 40 to 90 at % of Ru and from 10 to 60 at % of O and more preferably has a layer 1 containing from 40 to 75 at % of Ru and from 25 to 60 at % of O.

Second Embodiment

The second embodiment of the phase shift film 14 has a layer 1 containing from 30 to 98 at % of Ru, from 1 to 69 at % of O, and from 1 to 69 at % of N.

If the O content of the layer 1 is less than 1 at %, in the measurement by out-of-plane XRD method, a sharp peak derived from a crystalline phase of Ru is observed among diffraction peaks derived from the phase shift film 14 observed at 2θ: from 20° to 50°, and the half value width FWHM becomes less than 1.0°.

If the O content of the layer 1 is more than 69 at %, it is difficult to form the layer 1.

If the N content of the layer 1 is less than 1 at %, in the measurement by out-of-plane XRD method, a sharp peak derived from a crystalline phase of Ru is observed among diffraction peaks derived from the phase shift film 14 observed at 2θ: from 20° to 50°, and the half value width FWHM becomes less than 1.0°.

If the N content of the layer 1 is more than 69 at %, it is difficult to form the layer 1.

When the O content of the layer 1 is from 1 to 69 at % and the N content of the layer 1 is from 1 to 69 at %, in the measurement by out-of-plane XRD method, a sharp peak derived from a crystalline phase of Ru is not observed among diffraction peaks derived from the phase shift film 14 observed at 2θ: from 20° to 50°, and the half value width FWHM becomes 1.0° or more.

In the second embodiment of the phase shift film 14, the optical constant of the layer 1 changes due to introduction of O and therefore, the EUV light ray reflectance on the phase shift film surface can be adjusted by controlling the O content of the layer 1.

The second embodiment of the phase shift film 14 preferably has a layer 1 containing from 30 to 75 at % of Ru, from 24 to 69 at % of O, and from 1 to 20 at % of N and more preferably has a layer 1 containing from 30 to 65 at % of Ru, from 34 to 69 at % of O, and from 1 to 10 at % of N.

Third Embodiment

The third embodiment of the phase shift film 14 has a layer 1 containing from 30 to 98 at % of Ru and from 2 to 70 at % of N.

If the N content of the layer 1 is less than 2 at %, in the measurement by out-of-plane XRD method, a sharp peak derived from a crystalline phase of Ru is observed among diffraction peaks derived from the phase shift film 14 observed at 2θ: from 20° to 50°, and the half value width FWHM becomes less than 1.0°.

If the N content of the layer 1 is more than 70 at %, it is difficult to form the layer 1.

When the N content of the layer 1 is from 2 to 70 at %, in the measurement by out-of-plane XRD method, a sharp peak derived from a crystalline phase of Ru is not observed among diffraction peaks derived from the phase shift film 14 observed at 2θ: from 20° to 50°, and the half value width FWHM becomes 1.0° or more.

In the third embodiment of the phase shift film 14, the optical constant of the layer 1 is less changed by the introduction of N and therefore, the EUV light ray reflectance on the phase shift film surface can hardly be affected by the N content, so that the crystal structure of the phase shift film 14 can be rendered amorphous by the introduction of N without causing a large change in the EUV light ray reflectance on the phase shift film surface.

The third embodiment of the phase shift film 14 preferably has a layer 1 containing from 80 to 98 at % of Ru and from 2 to 20 at % of N.

For the purpose of adjusting the EUV light ray reflectance on the phase shift film 14 surface, in the first, second and third embodiments of the phase shift film 14, the layer 1 may further contain at least one element (X) selected from the group consisting of chromium (Cr), tantalum (Ta), titanium (Ti), rhenium (Re), tungsten (W), bismuth (Bi), manganese (Mn), platinum (Pt), copper (Cu), iridium (Tr) and vanadium (V). X is preferably Cr, Re, Mn and V, more preferably Cr and Re.

In the first, second and third embodiments of the phase shift film 14, in the case where the layer 1 contains the element (X), the composition ratio (at %) (Ru:X) of Ru to X in the layer 1 is in the range of 20:1 to 1:5. When the content ratio of the element (X) in the layer 1 is larger than 20:1 in terms of the composition ratio (Ru:X), the effect of adjusting the EUV light ray reflectance on the phase shift film 14 due to containing the element (X) is exerted. On the other hand, when the content ratio of the element (X) in the layer 1 is smaller than 1:5 in terms of the composition ratio (Ru:X), the film thickness necessary for obtaining a predetermined phase difference can be reduced.

The content ratio of the element (X) in the layer 1 is, in terms of the composition ratio (Ru:X), preferably from 4:1 to 1:4, more preferably from 2:1 to 1:2.

In the first embodiment of the phase shift film 14, in the case where the layer 1 contains the element (X), the layer 1 contains from 40 to 99 at % of a total (Ru+X) of Ru and X and from 1 to 60 at % of O, preferably contains from 50 to 99 at % of Ru+X and from 1 to 50 at % of O, and more preferably contains from 80 to 99 at % of Ru+X and from 1 to 20 at % of O.

In the second embodiment of the phase shift film 14, in the case where the layer 1 contains the element (X), the layer 1 contains from 30 to 98 at % of a total (Ru+X) of Ru and X, from 1 to 69 at % of O, and from 1 to 69 at % of N, preferably contains from 50 to 98 at % of Ru+X, from 1 to 30 at % of O, and from 1 to 20 at % of N, and more preferably contains from 70 to 98 at % of Ru+X, from 1 to 20 at % of O, and from 1 to 10 at % of N.

In the third embodiment of the phase shift film 14, in the case where the layer 1 contains the element (X), the layer 1 contains from 30 to 90 at % of a total (Ru+X) of Ru and X and from 10 to 70 at % of N, and preferably contains from 60 to 90 at % of Ru+X and from 10 to 40 at % of N.

Here, in the case where the layer 1 in the phase shift film 14 contains two or more elements as the element (X), X in the composition ratio (Ru:X) and the total (Ru+X) of Ru and X represents a total of the two or more elements.

The phase shift film 14 may be formed by stacking two or more out of the layers 1 in the first, second and third embodiments. In the case where the phase shift film 14 is formed by stacking two or more out of the layers 1 in the first, second and third embodiments, a part of the layers may contain the element (X) or all of the layers may contain the element (X). In the case where two or more layers contain the element (X), the elements (X) contained in respective layers may be the same or different.

The phase shift film 14 may further has a layer 2 containing at least one element (X) selected from the group consisting of Cr, Ta, Ti, Re, W, Bi, Mn, Pt, Cu, Ir and V. As the element (X), Cr, Ta, Pt and Ir are preferred, and Cr and Ta are more preferred.

The layer 2 may further contain at least one element selected from the group consisting of O, N, B and C.

The layer 2 does not contain Ru.

The phase shift film 14 may have two or more kinds of layers 2 differing in the contained elements.

The EUV light ray reflectance can be adjusted by configuring the phase shift film 14 to have the layer 2. However, if the thickness of the layer 2 is too large, the reflectance is excessively reduced. Therefore, the relative ratio of thicknesses of the layer 1 to the layer 2 ((thickness of layer 1):(thickness of layer 2)) is preferably from 1:1 to 30:1, more preferably from 5:1 to 20:1.

Here, in the case where the phase shift film 14 contains two or more layers 1, the above-described thickness of the layer 1 is a total film thickness of the two or more layers 1. In the case where the phase shift film 14 contains two or more layers 2, the above-described thickness of the layer 2 is a total film thickness of the two or more layers 2.

In the case where the phase shift film 14 contains the layer 2, the arrangement of the layer 1 and the layer 2 in the phase shift film 14 is not particularly limited. The layer 2 may be formed on the layer 1, or the layer 1 may be formed on the layer 2.

The layer 1 in the first, second and third embodiments of the phase shift film 14 can be formed using a known deposition method such as magnetron sputtering method or ion beam sputtering method.

For example, in the case of forming the layer 1 of the first embodiment of the phase shift film 14 by use of a reactive sputtering method, the method may be conducted using a Ru target as the target and using, as the sputtering gas, a mixed gas containing an inert gas and $O_2$ under the following deposition conditions.

Sputtering gas: A mixed gas of Ar gas and $O_2$ (volume ratio of $O_2$ gas in the mixed gas ($O_2/(Ar+O_2)$)=from 0.010 to 0.50, preferably from 0.010 to 0.30, more preferably from 0.010 to 0.200; gas pressure: from $5\times10^{-2}$ Pa to 1.0 Pa, preferably from $1\times10^{-1}$ Pa to $8\times10^{-1}$ Pa, more preferably from $2\times10^{-1}$ Pa to $4\times10^{-1}$ Pa)

Input power density per target area: from 1.0 W/cm$^2$ to 15.0 W/cm$^2$, preferably from 3.0 W/cm$^2$ to 12.0 W/cm$^2$, more preferably from 4.0 W/cm$^2$ to 10.0 W/cm$^2$ Deposition rate: from 0.010 nm/sec to 1.00 nm/sec, preferably from 0.015 nm/sec to 0.500 nm/sec, more preferably from 0.020 nm/sec to 0.300 nm/sec For example, in the case of forming the layer 1 of the second embodiment of the phase shift film 14 by use of a reactive sputtering method, the method may be conducted using a Ru target as the target and using, as the sputtering gas, a mixed gas of $O_2$ and $N_2$ or a mixed gas containing an inert gas, $O_2$ and $N_2$ under the following deposition conditions.

Sputtering gas: A mixed gas of Ar gas, $O_2$ and $N_2$ (volume ratio of $O_2$ gas in the mixed gas ($O_2/(Ar+O_2+N_2)$) =from 0.010 to 0.75, preferably from 0.010 to 0.500, more preferably from 0.010 to 0.200; volume ratio of $N_2$ gas in the mixed gas ($N_2/(Ar+O_2+N_2)$)=from 0.010 to 0.75, preferably from 0.010 to 0.500, more preferably from 0.010 to 0.200; gas pressure: from $5\times10^{-2}$ Pa to 1.0 Pa, preferably from $1\times10^{-1}$ Pa to $8\times10^{-1}$ Pa, more preferably from $2\times10^{-1}$ Pa to $4\times10^{-1}$ Pa)

Input power density per target area: from 1.0 W/cm$^2$ to 15.0 W/cm$^2$, preferably from 3.0 W/cm$^2$ to 12.0 W/cm$^2$, more preferably from 4.0 W/cm$^2$ to 10.0 W/cm$^2$ Deposition rate: from 0.010 nm/sec to 1.000 nm/sec, preferably from 0.015 nm/sec to 0.500 nm/sec, more preferably from 0.020 nm/sec to 0.300 nm/sec For example, in the case of forming the layer 1 of the third embodiment of the phase shift film 14 by use of a reactive sputtering method, the method may be conducted using a Ru target as the target and using, as the sputtering gas, a $N_2$ gas or a mixed gas containing an inert gas and $N_2$ under the following deposition conditions.

Sputtering gas: $N_2$ gas or a mixed gas of Ar gas and $N_2$ (volume ratio of $N_2$ gas in the mixed gas ($N_2/(Ar+N_2)$)=from 0.100 to 1.000, preferably from 0.200 to 0.750, more preferably from 0.250 to 0.500; gas pressure: from $5\times10^{-2}$ Pa to 1.0 Pa, preferably from $1\times10^{-1}$ Pa to $8\times10^{-1}$ Pa, more preferably from $2\times10^{-1}$ Pa to $4\times10^{-1}$ Pa)

Input power density per target area: from 1.0 W/cm$^2$ to 15.0 W/cm$^2$, preferably from 3.0 W/cm$^2$ to 12.0 W/cm$^2$, more preferably from 4.0 W/cm$^2$ to 10.0 W/cm$^2$ Deposition rate: from 0.010 nm/sec to 1.000 nm/sec, preferably from 0.015 nm/sec to 0.500 nm/sec, more preferably from 0.020 nm/sec to 0.300 nm/sec In the case where the phase shift film 14 contains the layer 2, the layer 2 can be formed using a known deposition method such as magnetron sputtering method or ion beam sputtering method.

For example, in the case of forming a layer 2 containing Ta as the element X and containing O and N by use of a reactive sputtering method, the method may be conducted using a Ta target as the target and using, as the sputtering gas, a mixed gas of $O_2$ and $N_2$ or a mixed gas containing an inert gas, $O_2$ and $N_2$ under the following deposition conditions.

Sputtering gas: A mixed gas of $O_2$ gas and $N_2$ or a mixed gas of Ar gas, $O_2$ and $N_2$ (volume ratio of $O_2$ gas in the mixed gas ($O_2/(O_2+N_2)$ or $O_2/(Ar+O_2+N_2)$)=from 0.010 to 0.750, preferably from 0.100 to 0.500, more preferably from 0.200 to 0.500; volume ratio of $N_2$ gas in the mixed gas ($N_2/(O_2+N_2)$ or $N_2/(Ar+O_2+N_2)$)=from 0.010 to 0.750, preferably from 0.010 to 0.500, more preferably from 0.010 to 0.200; gas pressure: from $5\times10^{-2}$ Pa to 1.0 Pa, preferably from $1\times10^{-1}$ Pa to $8\times10^{-1}$ Pa, more preferably from $2\times10^{-1}$ Pa to $4\times10^{-1}$ Pa)

Input power density per target area: from 1.0 W/cm$^2$ to 15.0 W/cm$^2$, preferably from 3.0 W/cm$^2$ to 12.0 W/cm$^2$, more preferably from 4.0 W/cm$^2$ to 10.0 W/cm$^2$ Deposition rate: from 0.010 nm/sec to 1.000 nm/sec, preferably from 0.015 nm/sec to 0.500 nm/sec, more preferably from 0.020 nm/sec to 0.300 nm/sec For example, in the case of forming a layer 2 containing Cr as the element X and containing N by use of a reactive sputtering method, the method may be conducted using a Cr target as the target and using, as the sputtering gas, a $N_2$ gas or a mixed gas containing an inert gas and $N_2$ under the following deposition conditions.

Sputtering gas: $N_2$ gas or a mixed gas of Ar gas and $N_2$ (volume ratio of $N_2$ gas in the mixed gas ($N_2/(Ar+N_2)$)=from 0.100 to 1.000, preferably from 0.200 to 0.750, more preferably from 0.250 to 0.500; gas pressure: from $5\times10^{-2}$ Pa to 1.0 Pa, preferably from $1\times10^{-1}$ Pa to $8\times10^{-1}$ Pa, more preferably from $2\times10^{-1}$ Pa to $4\times10^{-1}$ Pa)

Input power density per target area: from 1.0 W/cm$^2$ to 15.0 W/cm$^2$, preferably from 3.0 W/cm$^2$ to 12.0 W/cm$^2$, more preferably from 4.0 W/cm$^2$ to 10.0 W/cm$^2$ Deposition rate: from 0.010 nm/sec to 1.000 nm/sec, preferably from 0.015 nm/sec to 0.500 nm/sec, more preferably from 0.020 nm/sec to 0.300 nm/sec Here, in the case of using an inert gas other than Ar, the concentration of the inert gas is set to the same concentration range as the above-described Ar gas concentration. Also, in the case of using a plurality of kinds of inert gases, the total concentration of inert gases is set to the same concentration range as the above-described Ar gas concentration.

The thickness of the phase shift film 14 in the EUV mask blank 1a is preferably 20 nm or more, because desired optical properties as the later-described halftone EUV mask can be achieved.

In addition, the thickness of the layer 1 in the phase shift film 14 is preferably 10 nm or more, because desired optical properties as the later-described halftone EUV mask can be achieved.

When the reflectance for the light ray having a wavelength of around 13.5 nm at the time of irradiating the phase shift film 14 surface with light rays in a wavelength range of EUV light at an incident angle of 6° is defined as the EUV light ray reflectance on the phase shift film surface, and the reflectance for the light ray having a wavelength of around 13.5 nm at the time of irradiating the multilayer reflective film 12 surface with light rays in a wavelength range of EUV light at an incident angle of 6° is defined as the EUV light ray reflectance on the multilayer reflective film surface, the relative reflectance between the EUV light ray reflectance on the phase shift film surface and the EUV light ray reflectance on the multilayer reflective film surface ((EUV light ray reflectance on phase shift film surface/EUV light ray reflectance on multilayer reflective film surface)×100) is preferably from 2% to 37%, more preferably from 4% to 20%, still more preferably from 6% to 15%.

In addition, the phase difference between reflected light of EUV light from the multilayer reflective film 12 and reflected light of EUV light from the phase shift film 14 is preferably from 150° to 250°, more preferably from 180° to 230°.

The thickness of the phase shift film 14 in the EUV mask blank 1a is more preferably 30 nm or more, still more preferably 35 nm or more.

The thickness of the layer 1 in the phase shift film 14 is more preferably 20 nm or more, still more preferably 30 nm or more. The thickness of the layer 1 in the phase shift film 14 is preferably 60 nm or less, more preferably 55 nm or less.

The thickness of the phase shift film 14 in the EUV mask blank 1a is preferably 60 nm or less, because the shadowing effect is reduced.

In principle, use of a halftone EUV mask is an effective approach to enhance the resolution in EUV lithography. However, the optimal reflectance in the halftone EUV mask depends on the exposure conditions or the pattern transferred, and it is difficult to indiscriminately determine the reflectance.

Furthermore, EUV exposure is reflective exposure and therefore, the incident light enters not perpendicularly but from a slightly oblique (usually about 6°) direction and becomes reflected light from the EUV mask. In the EUV mask, the phase shift film is processed as a pattern, but since EUV light enters obliquely, a shadow appears. Consequently, depending on the incident direction and the pattern arrangement direction, a displacement from the original pattern position occurs in a transferred resist pattern formed by reflected light on a wafer. This is referred to as Shadowing Effect and is a problem in EUV exposure. The measure to reduce the shadowing effect is to reduce the length of the shadow. The shadow length may be reduced by having as low a pattern height as possible, and for having a low pattern height, it is necessary to form the phase shift film to be as thin as possible.

The thickness of the phase shift film 14 in the EUV mask blank 1a is more preferably 55 nm or less, still more preferably 50 nm or less.

For the pattern formation in the layer 1 of the first, second and third embodiments of the phase shift film 14, dry etching using, as the etching gas, $O_2$ or a mixed gas of $O_2$ and a halogen-based gas (chlorine-based gas, fluorine-based gas) is utilized.

It is preferred that when dry etching is conducted using, as the etching gas, $O_2$ or a mixed gas of $O_2$ and a halogen-based gas (chlorine-based gas, fluorine-based gas), the layer 1 of the phase shift film 14 can be etched at an etching rate of 10 nm/min or more.

As for the mixed gas of $O_2$ and a halogen-based gas, a gas containing 40 vol % or more and less than 100 vol %, preferably from 75 vol % to 90 vol %, of $O_2$ and containing more than 0 vol % and 60 vol % or less, preferably from 10 vol % to 25 vol %, of a chlorine-based gas or a fluorine-based gas, is used. As the chlorine-based gas, a chlorine-based gas such as $Cl_2$, $SiCl_4$, $CHCl_3$, $CCl_4$ and $BCl_3$, and a mixed gas thereof are used. As the fluorine-based gas, a fluorine-based gas such as $CF_4$, $CHF_3$, $SF_6$, $BF_3$ and $XeF_2$, and a mixed gas thereof are used.

By the introduction of O, the layer 1 of the first and second embodiments of the phase shift film 14 produces not only an effect of suppressing crystallization but also an effect of increasing the etching rate during dry etching using, as the etching gas, $O_2$ or a mixed gas of $O_2$ and a halogen-based gas (chlorine-based gas, fluorine-based gas). When the O content in the layer 1 is increased, etching at a rate as high as up to 2 times or more compared with a film containing only Ru is possible, and enhancement of the throughput can be expected.

Also, in the case where the layer 1 of the first, second and third embodiments of the phase shift film 14 contains the element (X), dry etching using, as the etching gas, $O_2$ or a mixed gas of $O_2$ and a halogen-based gas (chlorine-based gas, fluorine-based gas) is utilized for the pattern formation in the phase shift film.

At this time, when an element (X) forming a volatile oxide or acid halide, such as Cr, V, Mn and Re, is selected, pattern formation with little attachment to the pattern side wall can be expected.

In the case where the phase shift film 14 is composed of only the layer 1, pattern formation in the phase shift film can be achieved only by dry etching using, as the etching gas, $O_2$ or a mixed gas of $O_2$ and a halogen-based gas (chlorine-based gas, fluorine-based gas) and therefore, the pattern forming process is simple.

In the case where the phase shift film 14 has the layer 1 and the layer 2, pattern formation in the phase shift film can be achieved by stepwise dry etching using, if desired, two or more kinds of etching gases.

For example, in the case where the phase shift film 14 has the layer 1 and a layer 2 containing Ta as the element (X), the layer 1 is dry etched using, as the etching gas, $O_2$ or a mixed gas of $O_2$ and a halogen-based gas (chlorine-based gas, fluorine-based gas), and the layer 2 is dry etched using a halogen-based gas (chlorine-based gas, fluorine-based gas) as the etching gas, whereby pattern formation in the phase shift film can be achieved.

Also, in the case where the layer 2 contains an element forming a volatile oxide or acid halide, such as Cr, V, Mn and Re, pattern formation in the phase shift film can be achieved by subjecting the layer 1 and the layer 2 only to dry etching using, as the etching gas, $O_2$ or a mixed gas of $O_2$ and a halogen-based gas (chlorine-based gas, fluorine-based gas). Consequently, even when the phase shift film 14 has the layer 1 and the layer 2, the pattern formation in the phase shift film can be simply achieved without a cumbersome pattern forming process.

Figure 2:
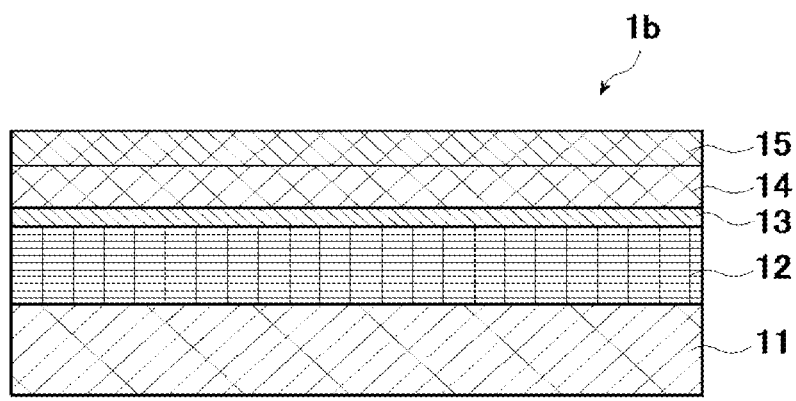
FIG. 2 is a schematic cross-sectional diagram illustrating another embodiment of the EUV mask blank of the present invention.

FIG. 2 is a schematic cross-sectional diagram illustrating another embodiment of the EUV mask blank of the present invention. In the EUV mask blank 1b illustrated in FIG. 2, a multilayer reflective film 12 for reflecting EUV light, a protective film 13 for the multilayer reflective film 12, a phase shift film 14 for shifting the phase of EUV light, and an etching mask film 15 are formed in this order on a substrate 11 from the substrate side. Out of the constituent elements of the EUV mask blank 1b, the substrate 11, the multilayer reflective film 12, the protective film 13, and the phase shift film 14 are the same as those in the EUV mask blank 1a above, and their descriptions are omitted.

In general, it is known that when a layer formed of a material having resistance to etching conditions for phase shift film is provided on the phase shift film, the thickness of a resist can be reduced. More specifically, when an etching mask film is formed and the etching rate of the phase shift film under the etching conditions for phase shift film is assumed to be 1, the thickness of a resist can be reduced by decreasing the relative rate (etching selection ratio) of the etching rate of the etching mask film.

The etching mask film 15 is required to have a sufficiently high etching selection ratio under the etching conditions for the phase shift film 14.

Therefore, the etching mask film 15 is required to have high etching resistance to dry etching using, as the etching gas, $O_2$ or a mixed gas of $O_2$ and a halogen-based gas (chlorine-based gas, fluorine-based gas).

On the other hand, the etching mask film 15 is preferably removable with a cleaning liquid using an acid or a base, which is used as the cleaning liquid for a resist in EUV lithography.

Specific example of the cleaning liquid used for the above-described purpose include sulfuric acid hydrogen peroxide mixture (SPM), ammonia hydrogen peroxide mixture, and hydrofluoric acid. SPM is a solution obtained by mixing sulfuric acid and hydrogen peroxide, and sulfuric acid and hydrogen peroxide can be mixed in a volume ratio of 4:1 to 1:3, preferably 3:1. At this time, the temperature of SPM is preferably controlled to 100° C. or more from the viewpoint of increasing the etching rate. The ammonia hydrogen peroxide mixture is a solution obtained by mixing ammonia and hydrogen peroxide, and $NH_4OH$, hydrogen peroxide and water can be mixed in a volume ratio of 1:1:5 to 3:1:5. At this time, the temperature of the ammonia hydrogen peroxide mixture is preferably controlled to be from 70° C. to 80° C.

In order to satisfy the requirements above, the etching mask film 15 of the EUV mask blank 1b of the present invention preferably contains at least one element selected from the group consisting of Nb, Ti, Mo, Ta and Si. The etching mask film 15 may further contain at least one element selected from the group consisting of O, N and B, that is, may be an oxide, a nitride, an oxynitride, or a boride of the element above. Specific examples of the constituent material of the etching mask film 15 include a Nb-based material such as Nb, $Nb_2O_5$ and NbON. The etching mask film 15 composed of such a Nb-based material can be etched by dry etching using a chlorine-based gas as the etching gas. Examples of the constituent material also include a Mo-based material such as Mo, $MoO_3$ and MoON. The etching mask film 15 composed of such a Mo-based material can be etched by dry etching using a chlorine-based gas as the etching gas. Examples of the constituent material also include a Si-based material such as Si, $SiO_2$ and $Si_3N_4$. The etching mask film 15 composed of such a Si-based material can be etched by dry etching using a fluorine-based gas as the etching gas. In the case of using a Si-based material as the etching mask film 15, removal using hydrofluoric acid as the cleaning liquid is preferred.

In view of removability with a cleaning liquid, the thickness of the etching mask film 15 is preferably 20 nm or less. The thickness of the etching mask film 15 composed of a Nb-based material is more preferably from 5 nm to 15 nm.

The etching mask film 15 can be formed by a known deposition method such as magnetron sputtering method or ion beam sputtering method.

In the case of forming a NbN film by a sputtering method, a reactive sputtering method using a Nb target may be conducted in a gas atmosphere formed by mixing an inert gas including at least one of He, Ar, Ne, Kr and Xe (hereinafter, simply referred to as inert gas) with nitrogen. In the case of using a magnetron sputtering method, the method may be conducted, specifically, under the following deposition conditions.

Sputtering gas: A mixed gas of Ar gas and $N_2$ (volume ratio of $N_2$ in the mixed gas ($N_2/(Ar+N_2)$)=15 vol % or more)

Gas pressure: from $5.0 \times 10^{-2}$ to 1.0 Pa, preferably from $1.0 \times 10^{-1}$ to $8.0 \times 10^{-1}$ Pa, more preferably from $2.0 \times 10^{-1}$ to $4.0 \times 10^{-1}$ Pa Input power density per target area: from 1.0 W/cm$^2$ to 15.0 W/cm$^2$, preferably from 3.0 W/cm$^2$ to 12.0 W/cm$^2$, more preferably from 4.0 W/cm$^2$ to 10.0 W/cm$^2$ Deposition rate: from 0.010 nm/sec to 1.0 nm/sec, preferably from 0.015 nm/sec to 0.50 nm/sec, more preferably from 0.020 nm/sec to 0.30 nm/sec Distance between target and substrate: from 50 mm to 500 mm, preferably from 100 mm to 400 mm, more preferably from 150 mm to 300 mm Here, in the case of using an inert gas other than Ar, the concentration of the inert gas is set to the same concentration range as the above-described Ar gas concentration. Also, in the case of using a plurality of kinds of inert gases, the total concentration of inert gases is set to the same concentration range as the above-described Ar gas concentration.

The EUV mask blank 1a or 1b of the present invention may include a functional film known in the field of EUV mask blanks, in addition to the multilayer reflective film 12, the protective film 13, the phase shift film 14 and the etching mask film 15. Specific examples of such a functional film include a high dielectric coating applied to the back surface side of the substrate so as to promote electrostatic chucking of the substrate, which is described, for example, in JP-T-2003-501823 (the term "JP-T" as used herein means a published Japanese translation of a PCT patent application). Here, the back surface of the substrate indicates, in the substrate 11 of FIG. 1, a surface opposite the side where the multilayer reflective film 12 is formed. With respect to the high dielectric coating applied to the back surface of the substrate for such a purpose, the electrical conductivity of the constituent material and the thickness are selected to give a sheet resistance of 100 Ω/sq or less. The constituent material of the high dielectric coating can be selected widely from those described in known literatures. For example, a high dielectric coating described in JP-T-2003-501823, specifically, a coating composed of Si, TiN, Mo, Cr or TaSi, may be applied. The thickness of the high dielectric coating may be, for example, from 10 to 1,000 nm.

The high dielectric coating can be formed using a known deposition method such as a sputtering method such as magnetron sputtering method or ion beam sputtering method, a CVD method, a vacuum vapor deposition method, or an electrolytic plating method.

The manufacturing method of an EUV mask blank of the present invention includes the following step a) to step c):

a) a step of forming, on a substrate, a multilayer reflective film for reflecting EUV light, b) a step of forming a phase shift film on the multilayer reflective film formed in the step a), and c) a step of forming an etching mask film on the phase shift film formed in the step b).

According to the manufacturing method of an EUV mask blank of the present invention, an EUV mask blank 1b illustrated in FIG. 2 is obtained.

Figure 3:
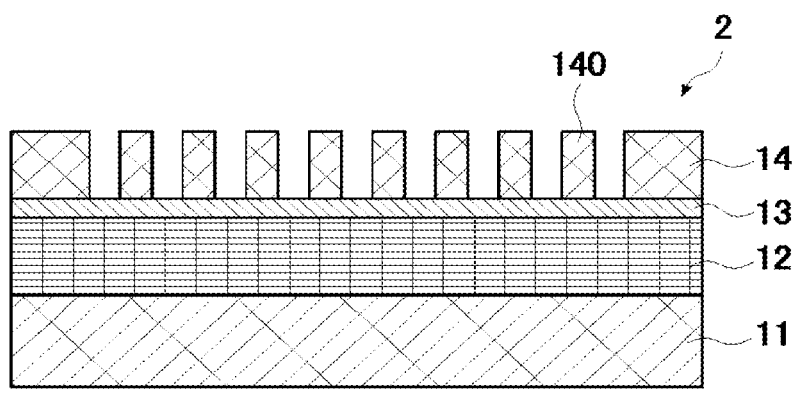
FIG. 3 is a schematic cross-sectional diagram illustrating one embodiment of the EUV mask of the present invention.

FIG. 3 is a schematic cross-sectional diagram illustrating one embodiment of the EUV mask of the present invention.

In the EUV mask 2 illustrated in FIG. 3, a pattern (phase shift film pattern) 140 is formed in the phase shift film 14 of the EUV mask blank 1a illustrated in FIG. 1. More specifically, a multilayer reflective film 12 for reflecting EUV light, a protective film 13 for the multilayer reflective film 12, and a phase shift film 14 for shifting the phase of EUV light are formed in this order on a substrate 11 from the substrate side, and a pattern (phase shift film pattern) 140 is formed in the phase shift film 14. Out of the constituent elements of the EUV mask 2, the substrate 11, the multilayer reflective film 12, the protective film 13, and the phase shift film 14 are the same as those in the EUV mask blank 1a above.

In the manufacturing method of an EUV mask of the present invention, the phase shift film 14 of the EUV mask blank 1b manufactured by the manufacturing method of an EUV mask blank of the present invention is patterned to form a pattern (phase shift film pattern) 140.

The procedure of forming a pattern in the phase shift film 14 of the EUV mask blank 1b is described by referring to the drawings.

Figure 4:
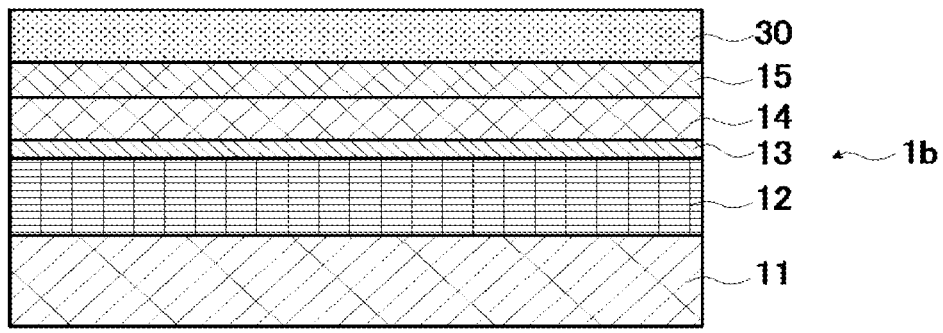
FIG. 4 is a diagram illustrating a procedure for forming a pattern in the EUV mask blank 1b illustrated in FIG. 2, and resist film 30 is formed on an etching mask film 15 of the EUV mask blank 1b.
Figure 5:
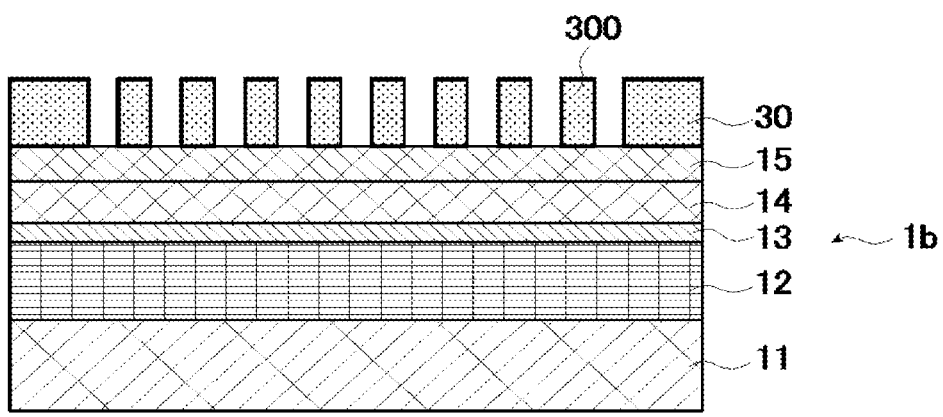
FIG. 5 is a diagram illustrating a procedure following FIG. 4, and a resist pattern 300 is formed in the resist film 30.
Figure 6:
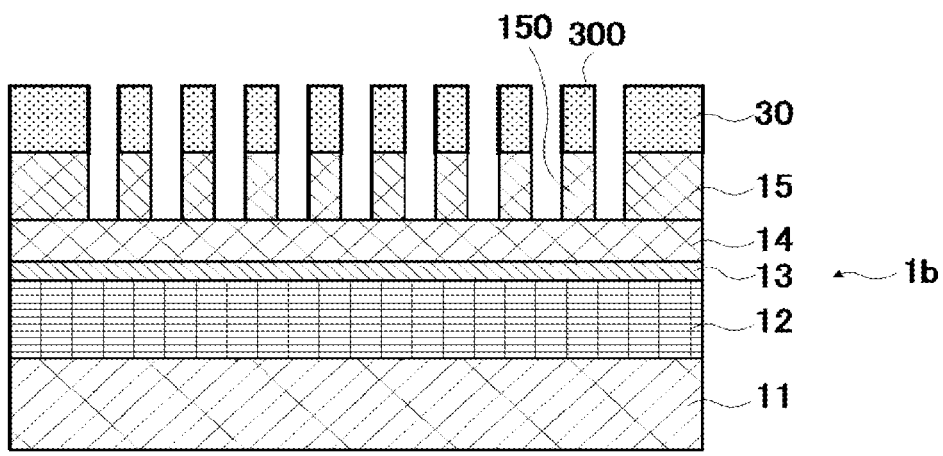
FIG. 6 is a diagram illustrating a procedure following FIG. 5, and an etching mask film pattern 150 is formed in the etching mask film 15.
Figure 7:
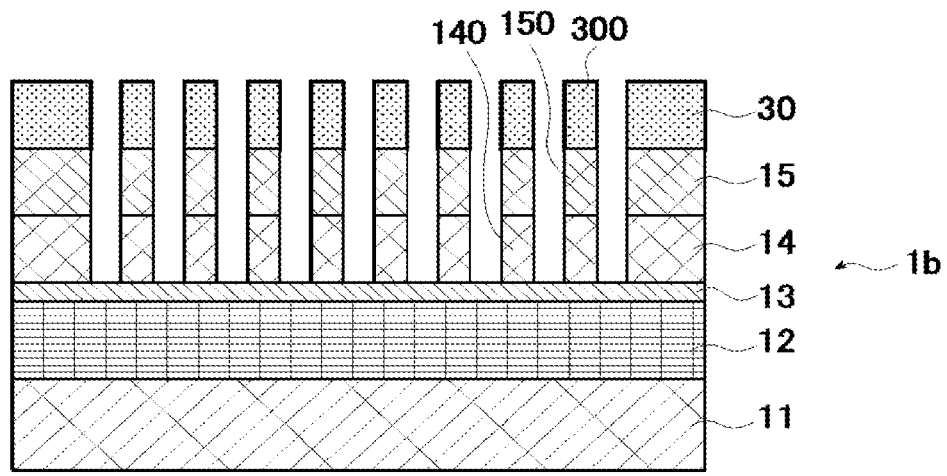
FIG. 7 is a diagram illustrating a procedure following FIG. 6, and a phase shift film pattern 140 is formed in the phase shift film 14.

As illustrated in FIG. 4, a resist film 30 is formed on the etching mask film 15 of the EUV mask blank 1b. Next, as illustrated in FIG. 5, a resist pattern 300 is formed in the resist film 30 using an electron beam lithography apparatus. Then, as illustrated in FIG. 6, an etching mask film pattern 150 is formed in the etching mask film 15 by using, as the mask, the resist film 30 in which the resist pattern 300 has been formed. For forming a pattern in the etching mask film 15 composed of a Nb-based material, dry etching using a chlorine-based gas as the etching gas is conducted. Subsequently, as illustrated in FIG. 7, a phase shift film pattern 140 is formed in the phase shift film 14 by using, as the mask, the etching mask film 15 in which the etching mask film pattern 150 has been formed. For forming a pattern in the phase shift film 14 containing Ru, dry etching using, as the etching gas, $O_2$ or a mixed gas of $O_2$ and a halogen-based gas (chlorine-based gas, fluorine-based gas) is conducted. Thereafter, the resist film 30 and the etching mask film 15 are removed with a cleaning liquid using an acid or a base to thereby obtain an EUV mask 2 in which the phase shift film pattern 140 is exposed. Here, although most of the resist pattern 300 and resist film 30 are removed in the process of forming the phase shift film pattern 140, cleaning with a cleaning liquid using an acid or a base is conducted with the purpose of removing the remaining resist pattern 300, resist film 30 and etching mask film 15.

EXAMPLES

The present invention is described in greater detail below by referring to Examples, but the present invention is not limited to these Examples. Out of Ex. 1 to Ex. 24, Ex. 1 to Ex. 17 are Examples of the invention, and Ex. 18 to Ex. 24 are Comparative Examples.

Ex. 1

In Ex. 1, an EUV mask blank 1a illustrated in FIG. 1 is manufactured.

As the substrate 11 for deposition, a $SiO_2$—$TiO_2$-based glass substrate (outer dimension: 6 inch (152 mm) square, thickness: 6.3 mm) is used. The glass substrate has a coefficient of thermal expansion at 20° C. of $0.02 \times 10^{-7}$/° C., a Young's modulus of 67 GPa, a Poisson's ratio of 0.17 and a specific rigidity of $3.07 \times 10^7$ $m^2/s^2$. This glass substrate is polished to have a smooth surface with a surface roughness (rms) of 0.15 nm or less and a flatness of 100 nm or less.

On the back surface side of the substrate 11, a Cr film with a thickness of 100 nm is deposited using a magnetron sputtering method to apply a high dielectric coating with a sheet resistance of 100 Ω/sq.

The substrate 11 (outer dimension: 6 inch (152 mm) square, thickness: 6.3 mm) is fixed to a flat plate-shaped usual electrostatic chuck via the formed Cr film, and an operation of alternately depositing a Si film and a Mo film on the front surface of the substrate 11 by using an ion beam sputtering method is repeated for 40 cycles to thereby form a Si/Mo multilayer reflective film 12 having a total film thickness of 272 nm ((4.5 nm+2.3 nm)×40).

Furthermore, a RuZr film (film thickness: 2.5 nm) is deposited on the Si/Mo multilayer reflective film 12 by using a DC sputtering method to form a protective film 13.

The deposition conditions for the Si film, Mo film and Ru film are as follows.

(Deposition Conditions for Si Film)
  Target: Si target (boron-doped)
  Sputtering gas: Ar gas (gas pressure: $2.0 \times 10^{-2}$ Pa)
  Voltage: 700 V
  Deposition rate: 0.077 nm/sec
  Film thickness: 4.5 nm (Deposition Conditions for Mo Film)
  Target: Mo target
  Sputtering gas: Ar gas (gas pressure: $2.0 \times 10^{-2}$ Pa)
  Voltage: 700 V
  Deposition rate: 0.064 nm/sec
  Film thickness: 2.3 nm (Deposition Conditions for RuZr Film)
  Target: Ru target, Zr target
  Sputtering gas: Ar gas (gas pressure: $2.0 \times 10^{-2}$ Pa)
  Ru Input power: 500 W
  Zr Input power: 150 W
  Deposition rate: 0.073 nm/sec
  Film thickness: 2.5 nm A layer 1 ($RuO_x$ film) of the phase shift film 14 containing Ru and O is then formed on the protective film by using a reactive sputtering method. The phase shift film 14 of this Example is composed of only the layer 1. The deposition conditions for the layer 1 of the phase shift film 14 are as follows.

(Deposition Conditions for $RuO_x$ Film)
  Target: Ru target
  Sputtering gas: A mixed gas of Ar gas and $O_2$ (volume ratio of $O_2$ gas in the mixed gas ($O_2/(Ar+O_2)$)=0.030, gas pressure: $2.0 \times 10^{-1}$ Pa)
  Input power density per target area: 7.4 W/cm$^2$
  Deposition rate: 0.170 nm/sec
  Film thickness: 39 nm With respect to the EUV mask blank 1a obtained according to the procedure above, the following evaluations (1) to (7) are conducted. In the following evaluations (1) to (7), the same evaluation results are obtained also in a mask blank where the $RuO_x$ film is deposited on a silicon wafer.

(1) Film Composition

The composition of the $RuO_x$ film is measured using X-ray Photoelectron Spectroscopy (manufactured by ULVAC-PHI, Inc.). The composition ratio (at %) of the $RuO_x$ film is Ru:O=91:9.

(2) Calculation of Phase Difference and Relative Reflectance in EUV Wavelength Range The phase difference between reflected light of EUV light from the multilayer reflective film 12 and reflected light of EUV light from the phase shift film 14, and the relative reflectance between EUV light ray reflectance on the phase shift film 14 surface and EUV light ray reflectance on the multilayer reflective film 12 surface are determined by optical simulation. As for the optical constant of the multilayer reflective film 12 necessary for the simulation, the value of data base of Center for X-Ray Optics, Lawrence Berkeley National Laboratory is used. In addition, as for the optical constant of the phase shift film 14, the value of data base of Center for X-Ray Optics, Lawrence Berkeley National Laboratory or value evaluated by measuring the "angle dependency" of the reflectance for light of a 13.5 nm range is used.

Specifically, the EUV reflectance, incident angle of EUV light, and optical constant are represented by the following formula:

$$R = |(\sin\theta - ((n+ik)^2 - \cos^2\theta)^{1/2})/(\sin\theta + ((n+ik)^2 - \cos^2\theta)^{1/2})|$$

In the formula above, $\theta$ is an incident angle of EUV light, R is an EUV reflectance at the incident angle $\theta$, n is a refractive index of the phase shift film 14, and k is an extinction coefficient of the phase shift film 14. The EUV optical constants ((refractive index (n) and extinction coefficient (k)) can be estimated by fitting measured values of the reflectance at respective EUV incident angles by use of the formula above.

The refractive index (n) of the phase shift film 14 is 0.900, and the extinction coefficient (k) is 0.017.

The phase difference in the EUV wavelength range is 216°, and the relative reflectance is 31.9%.

(3) Crystal Peak Derived from Phase Shift Film

With respect to the phase shift film ($RuO_x$ film), measurement by the out-of-plane XRD method is conducted. The half value width FWHM of a peak having the highest intensity among diffraction peaks derived from the phase shift film observed at 2θ: from 20° to 50° is determined.

The half value width FWHM is 1.0°, and the crystal structure of the phase shift film ($RuO_x$ film) is amorphous.

(4) Etching Rate

A sample where the phase shift film ($RuO_x$ film) has been formed is placed on a sample table of an ICP (inductively coupled) plasma etching apparatus and subjected to ICP plasma etching under the following conditions to determine the etching rate.

ICP Antenna bias: 200 W
Substrate bias: 40 W
Etching time: 30 sec
Trigger pressure: $3.0 \times 10^0$ Pa
Etching pressure: $3.0 \times 10^{-1}$ Pa
Etching gas: A mixed gas of $O_2$ and $Cl_2$
Gas flow rate ($Cl_2/O_2$): 10/10 sccm
The etching rate is 25 nm/min.

Ex. 2

Ex. 2 is conducted according to the same procedure as in Ex. 1 except that the deposition conditions for the layer 1 ($RuO_x$ film) of the phase shift film 14 are changed to the following conditions.

(Deposition Conditions for $RuO_x$ Film)
Target: Ru target
Sputtering gas: A mixed gas of Ar gas and $O_2$ (volume ratio of $O_2$ gas in the mixed gas ($O_2/(Ar+O_2)$)=0.04, gas pressure: $2.0 \times 10^{-1}$ Pa)
Input power density per target area: 7.4 W/cm$^2$
Deposition rate: 0.22 nm/sec
Film thickness: 45 nm
The composition ratio (at %) of the $RuO_x$ film is Ru:O=76:24.

The refractive index (n) of the $RuO_x$ film is 0.912, and the extinction coefficient (k) is 0.019.

The phase difference in the EUV wavelength range is 216°, and the relative reflectance is 23.5%.

The half value width FWHM of a crystal peak derived from the phase shift film ($RuO_x$ film) is 2.6°, and the crystal structure of the phase shift film ($RuO_x$ film) is amorphous.

The etching rate of the phase shift film ($RuO_x$ film) is 36 nm/min.

Ex. 3

Ex. 3 is conducted according to the same procedure as in Ex. 1 except that the deposition conditions for the layer 1 ($RuO_x$ film) of the phase shift film 14 are changed to the following conditions.

(Deposition Conditions for $RuO_x$ Film)
Target: Ru target
Sputtering gas: A mixed gas of Ar gas and $O_2$ (volume ratio of $O_2$ gas in the mixed gas ($O_2/(Ar+O_2)$)=0.05, gas pressure: $2.0 \times 10^{-1}$ Pa)
Input power density per target area: 7.4 W/cm$^2$
Deposition rate: 0.22 nm/sec
Film thickness: 45 nm
The composition ratio (at %) of the $RUO_x$ film is Ru:O=67:33.

The refractive index (n) of the $RuO_x$ film is 0.919, and the extinction coefficient (k) is 0.020.

The phase difference in the EUV wavelength range is 216°, and the relative reflectance is 15.2%.

The half value width FWHM of a crystal peak derived from the phase shift film ($RuO_x$ film) is 3.2°, and the crystal structure of the phase shift film ($RuO_x$ film) is amorphous.

The etching rate of the phase shift film ($RuO_x$ film) is 41 nm/min.

Ex. 4

Ex. 4 is conducted according to the same procedure as in Ex. 1 except that a layer 1 (RuN film) of the phase shift film 14 containing Ru and N is formed on the protective film by using a reactive sputtering method. The deposition conditions for the layer 1 of the phase shift film 14 are as follows.

(Deposition Conditions for RuN Film)
Target: Ru target
Sputtering gas: A mixed gas of Ar gas and $N_2$ (volume ratio of $N_2$ gas in the mixed gas ($N_2/(Ar+N_2)$)=0.5, gas pressure: $2.0 \times 10^{-1}$ Pa)
Input power density per target area: 1.7 W/cm$^2$
Deposition rate: 0.017 nm/sec
Film thickness: 39 nm
The composition ratio (at %) of the RuN film is Ru:N=98:2.

The refractive index (n) of the RuN film is 0.890, and the extinction coefficient (k) is 0.016.

The phase difference in the EUV wavelength range is 216°, and the relative reflectance is 35.4%.

The half value width FWHM of a crystal peak derived from the phase shift film (RuN film) is 1.2°, and the crystal structure of the phase shift film (RuN film) is amorphous.

The etching rate of the phase shift film (RuN film) is 23 nm/min.

Ex. 5

Ex. 5 is conducted according to the same procedure as in Ex. 1 except that a layer 1 (RuON film) of the phase shift film 14 containing Ru, O and N is formed on the protective film by using a reactive sputtering method. The deposition conditions for the layer 1 of the phase shift film 14 are as follows.

(Deposition Conditions for RuON Film)
Target: Ru target
Sputtering gas: A mixed gas of Ar gas, $O_2$ and $N_2$ (volume ratio of $O_2$ gas in the mixed gas ($O_2/(Ar+O_2+N_2)$) =0.013, volume ratio of $N_2$ gas in the mixed gas ($N_2/(Ar+O_2+N_2)$)=0.2, gas pressure: $2.0\times10^{-1}$ Pa)
Input power density per target area: 7.4 W/cm$^2$
Deposition rate: 0.13 nm/sec
Film thickness: 39 nm The composition ratio (at %) of the RuON film is Ru:O: N=93:2:5 (Ru:O+N=93:7).

The refractive index (n) of the RuON film is 0.901, and the extinction coefficient (k) is 0.017.

The phase difference in the EUV wavelength range is 216°, and the relative reflectance is 31.8%.

The half value width FWHM of a crystal peak derived from the phase shift film (RuON film) is 1.9°, and the crystal structure of the phase shift film (RuON film) is amorphous.

The etching rate of the phase shift film (RuON film) is 26 nm/min.

Ex. 6

Ex. 6 is conducted according to the same procedure as in Ex. 5 except that the deposition conditions for the layer 1 (RuON film) of the phase shift film 14 are changed to the following conditions.

(Deposition Conditions for RuON Film)
Target: Ru target
Sputtering gas: A mixed gas of Ar gas, $O_2$ and $N_2$ (volume ratio of $O_2$ gas in the mixed gas ($O_2/(Ar+O_2+N_2)$) =0.026, volume ratio of $N_2$ gas in the mixed gas ($N_2/(Ar+O_2+N_2)$)=0.2, gas pressure: $2.0\times10^{-1}$ Pa)
Input power density per target area: 7.4 W/cm$^2$
Deposition rate: 0.17 nm/sec
Film thickness: 39 nm The composition ratio (at %) of the RuON film is Ru:O: N=76:14:10 (Ru:O+N=76:24).

The refractive index (n) of the RuON film is 0.912, and the extinction coefficient (k) is 0.019.

The phase difference in the EUV wavelength range is 216°, and the relative reflectance is 23.5%.

Since a crystal peak derived from the phase shift film (RuON film) is not observed, the half value width FWHM is 180°, and the crystal structure of the phase shift film (RuON film) is amorphous.

The etching rate of the phase shift film (RuON film) is 32 nm/min.

Ex. 7

Ex. 7 is conducted according to the same procedure as in Ex. 5 except that the deposition conditions for the layer 1 (RuON film) of the phase shift film 14 are changed to the following conditions.

(Deposition Conditions for RuON Film)
Target: Ru target
Sputtering gas: A mixed gas of Ar gas, $O_2$ and $N_2$ (volume ratio of $O_2$ gas in the mixed gas ($O_2/(Ar+O_2+N_2)$) =0.051, volume ratio of $N_2$ gas in the mixed gas ($N_2/(Ar+O_2+N_2)$)=0.19, gas pressure: $2.0\times10^{-1}$ Pa)
Input power density per target area: 7.4 W/cm$^2$
Deposition rate: 0.21 nm/sec
Film thickness: 46 nm The composition ratio (at %) of the RuON film is Ru:O: N=62:29:9 (Ru:O+N=62:38).

The refractive index (n) of the RuON film is 0.919, and the extinction coefficient (k) is 0.020.

The phase difference in the EUV wavelength range is 1.2°, and the relative reflectance is 11.8%.

Since a crystal peak derived from the phase shift film (RuON film) is not observed, the half value width FWHM is 180°, and the crystal structure of the phase shift film (RuON film) is amorphous.

The etching rate of the phase shift film (RuON film) is 35 nm/min.

Ex. 8

Ex. 8 is conducted according to the same procedure as in Ex. 5 except that the deposition conditions for the layer 1 (RuON film) of the phase shift film 14 are changed to the following conditions.

(Deposition Conditions for RuON Film)
Target: Ru target
Sputtering gas: A mixed gas of Ar gas, $O_2$ and $N_2$ (volume ratio of $O_2$ gas in the mixed gas ($O_2/(Ar+O_2+N_2)$) =0.17, volume ratio of $N_2$ gas in the mixed gas ($N_2/(Ar+O_2+N_2)$)=0.17, gas pressure: $2.0\times10^{-1}$ Pa)
Input power density per target area: 7.4 W/cm$^2$
Deposition rate: 0.20 nm/sec
Film thickness: 52 nm The composition ratio (at %) of the RuON film is Ru:O: N=38:51:11 (Ru:O±N=38:62).

The refractive index (n) of the RuON film is 0.922, and the extinction coefficient (k) is 0.021.

The phase difference in the EUV wavelength range is 216°, and the relative reflectance is 15.7%.

Since a crystal peak derived from the phase shift film (RuON film) is not observed, the half value width FWHM is 180°, and the crystal structure of the phase shift film (RuON film) is amorphous.

The etching rate of the phase shift film (RuON film) is 37 nm/min

Ex. 9

Ex. 9 is conducted according to the same procedure as in Ex. 1 except that a layer 1 (RuCrN film) of the phase shift film 14 containing Ru, Cr and N is formed on the protective film by using a reactive sputtering method. The deposition conditions for the layer 1 of the phase shift film 14 are as follows.

(Deposition Conditions for RuCrN Film)
Target: Ru target, Cr target
Sputtering gas: A mixed gas of Ar gas and $N_2$ (volume ratio of $N_2$ gas in the mixed gas ($N_2/(Ar+N_2)$)=1, gas pressure: $2.5\times10^{-1}$ Pa)
Input power density per target area:
Ru target: 4.9 W/cm$^2$
Cr target: 9.9 W/cm$^2$
Deposition rate: 0.10 nm/sec
Film thickness: 52 nm The composition ratio (at %) of the RuCrN film is Ru:Cr:N=37:33:30 (Ru+Cr:N=70:30, Cr/Ru=0.9).

The refractive index (n) of the RuCrN film is 0.921, and the extinction coefficient (k) is 0.023.

The phase difference in the EUV wavelength range is 216°, and the relative reflectance is 8.7%.

The half value width FWHM of a crystal peak derived from the phase shift film (RuCrN film) is 2.3°, and the crystal structure of the phase shift film (RuCrN film) is amorphous.

The etching rate of the phase shift film (RuCrN film) is not measured.

Ex. 10

Ex. 10 is conducted according to the same procedure as in Ex. 1 except that a layer 1 (RuCrON film) of the phase shift film 14 containing Ru, Cr, O and N is formed on the protective film by using a reactive sputtering method. The deposition conditions for the layer 1 of the phase shift film 14 are as follows.
(Deposition Conditions for RuCrON Film)
    Target: Ru target, Cr target
    Sputtering gas: A mixed gas of Ar gas, $N_2$ and $O_2$ (volume ratio of $N_2$ gas in the mixed gas ($N_2/(Ar+O_2+N_2)$)=0.2, volume ratio of $O_2$ gas in the mixed gas ($O_2/(Ar+O_2+N_2)$)=0.033, gas pressure: $2.0\times10^{-1}$ Pa)
    Input power density per target area:
        Ru target: 4.9 W/cm$^2$
        Cr target: 9.9 W/cm$^2$
    Deposition rate: 0.31 nm/sec
    Film thickness: 52 nm
The composition ratio (at %) of the RuCrON film is Ru:Cr:O:N=14:35:41:10 (Ru+Cr:O+N=49:51, Cr/Ru=2.5).

The refractive index (n) of the RuCrON film is 0.923, and the extinction coefficient (k) is 0.031.

The phase difference in the EUV wavelength range is 216°, and the relative reflectance is 12.6%.

Since a crystal peak derived from the phase shift film (RuCrON film) is not observed, the half value width FWHM is 180°, and the crystal structure of the phase shift film (RuCrON film) is amorphous.

The etching rate of the phase shift film (RuCrON film) is not measured.

Ex. 11

Ex. 11 is conducted according to the same procedure as in Ex. 1 except that a layer 1 (RuReON film) of the phase shift film 14 containing Ru, Re, O and N is formed on the protective film by using a reactive sputtering method. The deposition conditions for the layer 1 of the phase shift film 14 are as follows.
(Deposition Conditions for RuReON Film)
    Target: Ru target, Re target
    Sputtering gas: A mixed gas of Ar gas, $N_2$ and $O_2$ (volume ratio of $N_2$ gas in the mixed gas ($N_2/(Ar+O_2+N_2)$)=0.2, volume ratio of $O_2$ gas in the mixed gas ($O_2/(Ar+O_2+N_2)$)=0.1, gas pressure: $3.0\times10^{-1}$ Pa)
    Input power density per target area:
        Ru target: 2.5 W/cm$^2$
        Re target: 7.4 W/cm$^2$
    Deposition rate: 0.16 nm/sec
    Film thickness: 52 nm
The composition ratio (at %) of the RuReON film is Ru:Re:O:N=16:71:2:11 (Ru+Re:O+N=87:13, Re/Ru=4.4).

The refractive index (n) of the RuReON film is 0.928, and the extinction coefficient (k) is 0.029.

The phase difference in the EUV wavelength range is 216°, and the relative reflectance is 6.1%.

The half value width FWHM of a crystal peak derived from the phase shift film (RuReON film) is 4°, and the crystal structure of the phase shift film (RuReON film) is amorphous.

The etching rate of the phase shift film (RuReON film) is not measured.

Ex. 12

Ex. 12 is conducted according to the same procedure as in Ex. 11 except that the deposition conditions for the layer 1 (RuReON film) of the phase shift film 14 are changed to the following conditions.
(Deposition Conditions for RuReON Film)
    Target: Ru target, Re target
    Sputtering gas: A mixed gas of Ar gas, $N_2$ and $O_2$ (volume ratio of $N_2$ gas in the mixed gas ($N_2/(Ar+O_2+N_2)$)=0.2, volume ratio of $O_2$ gas in the mixed gas ($O_2/(Ar+O_2+N_2)$)=0.016, gas pressure: $3.0\times10^{-1}$ Pa)
    Input power density per target area:
        Ru target: 7.4 W/cm$^2$
        Re target: 7.4 W/cm$^2$
    Deposition rate: 0.30 nm/sec
    Film thickness: 52 nm
The composition ratio (at %) of the RuReON film is Ru:Re:O:N=41:48:2:9 (Ru+Re:O+N=89:11, Re/Ru=1.2).

The refractive index (n) of the RuReON film is 0.914, and the extinction coefficient (k) is 0.026.

The phase difference in the EUV wavelength range is 216°, and the relative reflectance is 14.2%.

The half value width FWHM of a crystal peak derived from the phase shift film (RuReON film) is 1.3°, and the crystal structure of the phase shift film (RuReON film) is amorphous.

The etching rate of the phase shift film (RuReON film) is not measured.

Ex. 13

Ex. 13 is conducted according to the same procedure as in Ex. 11 except that the deposition conditions for the layer 1 (RuReON film) of the phase shift film 14 are changed to the following conditions.
(Deposition Conditions for RuReON Film)
    Target: Ru target, Re target
    Sputtering gas: A mixed gas of Ar gas, $N_2$ and $O_2$ (volume ratio of $N_2$ gas in the mixed gas ($N_2/(Ar+O_2+N_2)$)=0.2, volume ratio of $O_2$ gas in the mixed gas ($O_2/(Ar+O_2+N_2)$)=0.016, gas pressure: $3.0\times10^{-1}$ Pa)
    Input power density per target area:
        Ru target: 7.4 W/cm$^2$
        Re target: 2.5 W/cm$^2$
    Deposition rate: 0.19 nm/sec
    Film thickness: 44 nm
The composition ratio (at %) of the RuReON film is Ru:Re:O:N=71:18:3:8 (Ru+Re:O+N=89:11, Re/Ru=0.3).

The refractive index (n) of the RuReON film is 0.904, and the extinction coefficient (k) is 0.020.

The phase difference in the EUV wavelength range is 216°, and the relative reflectance is 21.0%.

The half value width FWHM of a crystal peak derived from the phase shift film (RuReON film) is 3°, and the crystal structure of the phase shift film (RuReON film) is amorphous.

The etching rate of the phase shift film (RuReON film) is not measured.

Ex. 14

Ex. 14 is conducted according to the same procedure as in Ex. 9 except that the deposition conditions for the layer 1 (RuCrN film) of the phase shift film 14 are changed to the following conditions.

(Deposition Conditions for RuCrN Film)
　Target: Ru target, Cr target
　Sputtering gas: A mixed gas of Ar gas and $N_2$ (volume ratio of $N_2$ gas in the mixed gas $(N_2/(Ar+N_2))$=0.17, gas pressure: $2.0\times10^{-1}$ Pa)
　Input power density per target area:
　　Ru target: 3.7 W/cm$^2$
　　Cr target: 4.9 W/cm$^2$
　Deposition rate: 0.07 nm/sec
　Film thickness: 40 nm The composition ratio (at %) of the RuCrN film is Ru:Cr:N=42:44:14 (Ru+Cr:N=86:14, Cr/Ru=1).

The refractive index (n) of the RuCrN film is 0.920, and the extinction coefficient (k) is 0.024.

The phase difference in the EUV wavelength range is 216°, and the relative reflectance is 10.2%.

The half value width FWHM of a crystal peak derived from the phase shift film (RuCrN film) is 2.8°, and the crystal structure of the phase shift film (RuCrN film) is amorphous.

The etching rate of the phase shift film (RuCrN film) is not measured.

Ex. 15

Ex. 15 is conducted according to the same procedure as in Ex. 1 except that a layer 1 (RuCrO film) of the phase shift film 14 containing Ru, Cr, and O is formed on the protective film by using a reactive sputtering method. The deposition conditions for the layer 1 of the phase shift film 14 are as follows.

(Deposition Conditions for RuCrO Film)
　Target: Ru target, Cr target
　Sputtering gas: A mixed gas of Ar gas and $O_2$ (volume ratio of $O_2$ gas in the mixed gas $(O_2/(Ar+O_2))$=0.2, gas pressure: $2.0\times10^{-1}$ Pa)
　Input power density per target area:
　　Ru target: 7.4 W/cm$^2$
　　Cr target: 5.9 W/cm$^2$
　Deposition rate: 0.49 nm/sec
　Film thickness: 40 nm The composition ratio (at %) of the RuCrO film is Ru:Cr:O=20:30:50 (Ru+Cr:O=50:50, Cr/Ru=0.6).

The refractive index (n) of the RuCrO film is 0.929, and the extinction coefficient (k) is 0.027.

The phase difference in the EUV wavelength range is 216°, and the relative reflectance is 7.3%.

Since a crystal peak derived from the phase shift film (RuCrO film) is not observed, the half value width FWHM is 180°, and the crystal structure of the phase shift film (RuCrO film) is amorphous.

The etching rate of the phase shift film (RuCrO film) is not measured.

Ex. 16

Ex. 16 is conducted according to the same procedure as in Ex. 1 except that a layer 1 (RuON film) of the phase shift film 14 containing Ru, O and N is formed on the protective film by using a reactive sputtering method and a layer 2 (TaON film) of the phase shift film 14 containing Ta, O and N is formed by using a reactive sputtering method.

The deposition conditions for the layer 1 and layer 2 of the phase shift film 14 are as follows.

(Deposition Conditions for RuON Film)
　Target: Ru target
　Sputtering gas: A mixed gas of Ar gas, $O_2$ and $N_2$ (volume ratio of $O_2$ gas in the mixed gas $(O_2/(Ar+O_2+N_2))$=0.17, volume ratio of $N_2$ gas in the mixed gas $(N_2/(Ar+O_2+N_2))$=0.17, gas pressure: $2.0\times10^{-1}$ Pa)
　Input power density per target area: 7.4 W/cm$^2$
　Deposition rate: 0.20 nm/sec
　Film thickness: 48 nm (Deposition Conditions for TaON Film)
　Target: Ta target
　Sputtering gas: A mixed gas of Ar gas, $O_2$ and $N_2$ (volume ratio of $O_2$ gas in the mixed gas $(O_2/(Ar+O_2+N_2))$=0.4, volume ratio of $N_2$ gas in the mixed gas $(N_2/(Ar+O_2+N_2))$=0.1, gas pressure: $2.0\times10^{-1}$ Pa)
　Input power density per target area: 7.4 W/cm$^2$
　Deposition rate: 0.10 nm/sec
　Film thickness: 4 nm The composition ratio (at %) of the RuON film is Ru:O:N=38:51:11 (Ru:O+N=38:62).

The refractive index (n) of the RuON film is 0.922, and the extinction coefficient (k) is 0.021.

The refractive index (n) of the TaON film is 0.955, and the extinction coefficient (k) is 0.025.

The phase difference in the EUV wavelength range is 216°, and the relative reflectance is 12.9%.

Since a crystal peak derived from the phase shift film (layer 1 (RuON film), layer 2 (TaON film)) is not observed, the half value width FWHM is 180°, and the crystal structure of the phase shift film 14 including the layer 1 (RuON film) and the layer 2 (TaON film) is amorphous.

The etching rates of the layer 1 (RuON film) and layer 2 (TaON film) of the phase shift film 14 are not measured.

Ex. 17

Ex. 17 is conducted according to the same procedure as in Ex. 1 except that a layer 2 (CrN film) of the phase shift film 14 containing Cr and N is formed on the protective film by using a reactive sputtering method and a layer 1 (RuON film) of the phase shift film 14 containing Ru, O and N is formed by using a reactive sputtering method.

The deposition conditions for the layer 2 and layer 1 of the phase shift film 14 are as follows.

(Deposition Conditions for CrN Film)
　Target: Cr target
　Sputtering gas: A mixed gas of Ar gas and $N_2$ (volume ratio of $N_2$ gas in the mixed gas $(N_2/(Ar+N_2))$=0.2, gas pressure: $2.0\times10^{-1}$ Pa)
　Input power density per target area: 9.9 W/cm$^2$
　Deposition rate: 0.09 nm/sec
　Film thickness: 4 nm (Deposition Conditions for RuON Film)
　Target: Ru target
　Sputtering gas: A mixed gas of Ar gas, $O_2$ and $N_2$ (volume ratio of $O_2$ gas in the mixed gas $(O_2/(Ar+O_2+N_2))$=0.17, volume ratio of $N_2$ gas in the mixed gas $(N_2/(Ar+O_2+N_2))$=0.17, gas pressure: $2.0\times10^{-1}$ Pa)
　Input power density per target area: 7.4 W/cm$^2$
　Deposition rate: 0.20 nm/sec
　Film thickness: 48 nm The composition ratio (at %) of the RuON film is Ru:O:N=38:51:11 (Ru:O+N=38:62).

The refractive index (n) of the RuON film is 0.922, and the extinction coefficient (k) is 0.021.

The refractive index (n) of the CrN film is 0.928, and the extinction coefficient (k) is 0.039.

The phase difference in the EUV wavelength range is 216°, and the relative reflectance is 13.6%.

The half value width FWHM of a crystal peak derived from the phase shift film (layer 2 (CrN film), layer 1 (RuON film)) is 3.6°, and the crystal structure of the phase shift film 14 including the layer 2 (CrN film) and the layer 1 (RuON film) is amorphous.

The etching rates of the layer 2 (CrN film) and layer 1 (RuON film) of the phase shift film 14 are not measured.

Ex. 18

Ex. 18 is conducted according to the same procedure as in Ex. 1 except that a phase shift film 14 (Ru film) containing Ru is formed on the protective film by using a DC sputtering method. The deposition conditions for the phase shift film 14 are as follows.
(Deposition Conditions for Ru Film)
 Target: Ru target
 Sputtering gas: Ar gas (gas pressure: $2.0 \times 10^{-1}$ Pa)
 Input power density per target area: 7.4 W/cm$^2$
 Deposition rate: 0.14 nm/sec
 Film thickness: 40 nm The half value width FWHM of a crystal peak derived from the phase shift film (Ru film) is 0.42°, and the crystal structure of the phase shift film (Ru film) is crystalline.

The phase difference in the EUV wavelength range and the relative reflectance are not measured.

The etching rate of the phase shift film (Ru film) is not measured.

Ex. 19

Ex. 19 is conducted according to the same procedure as in Ex. 1 except that a phase shift film 14 (RuO$_2$ film) containing Ru and O is formed on the protective film by using a reactive sputtering method. The deposition conditions for the phase shift film 14 are as follows.
(Deposition Conditions for RuO$_2$ Film)
 Target: Ru target
 Sputtering gas: A mixed gas of Ar gas and O$_2$ (volume ratio of O$_2$ gas in the mixed gas (O$_2$/(Ar+O$_2$))=0.13, gas pressure: $2.0 \times 10^{-1}$ Pa)
 Input power density per target area: 7.4 W/cm$^2$
 Deposition rate: 0.26 nm/sec
 Film thickness: 40 nm The composition ratio (at %) of the RuO$_2$ film is Ru:O=38:62.

The half value width FWHM of a crystal peak derived from the phase shift film (RuO$_2$ film) is 0.82°, and the crystal structure of the phase shift film (RuO$_2$ film) is crystalline.

The phase difference in the EUV wavelength range and the relative reflectance are not measured.

The etching rate of the phase shift film (RuO$_2$ film) is not measured.

Ex. 20

Ex. 20 is conducted according to the same procedure as in Ex. 1 except that a phase shift film 14 (RuCr film) containing Ru and Cr is formed on the protective film by using a binary sputtering method. The deposition conditions for the phase shift film 14 are as follows.
(Deposition Conditions for RuCr Film)
 Target: Ru target, Cr target
 Sputtering gas: Ar gas (gas pressure: $2.0 \times 10^{-1}$ Pa)
 Input power density per target area:
  Ru target: 7.4 W/cm$^2$
  Cr target: 4.9 W/cm$^2$
 Deposition rate: 0.21 nm/sec
 Film thickness: 40 nm The composition ratio (at %) of the RuCr film is Ru:Cr=65:35.

The half value width FWHM of a crystal peak derived from the phase shift film (RuCr film) is 0.34°, and the crystal structure of the phase shift film (RuCr film) is crystalline.

The phase difference in the EUV wavelength range and the relative reflectance are not measured.

The etching rate of the phase shift film (RuCr film) is not measured.

Ex. 21

Ex. 21 is conducted according to the same procedure as in Ex. 1 except that a phase shift film 14 (RuRe film) containing Ru and Re is formed on the protective film by using a binary sputtering method. The deposition conditions for the phase shift film 14 are as follows.
(Deposition Conditions for RuRe Film)
 Target: Ru target, Re target
 Sputtering gas: Ar gas (gas pressure: $2.0 \times 10^{-1}$ Pa)
 Input power density per target area:
  Ru target: 7.4 W/cm$^2$
  Re target: 7.4 W/cm$^2$
 Deposition rate: 0.25 nm/sec
 Film thickness: 40 nm The composition ratio (at %) of the RuRe film is Ru:Re=50:50.

The half value width FWHM of a crystal peak derived from the phase shift film (RuRe film) is 0.40°, and the crystal structure of the phase shift film (RuRe film) is crystalline.

The phase difference in the EUV wavelength range and the relative reflectance are not measured.

The etching rate of the phase shift film (RuRe film) is not measured.

Ex. 22

Ex. 22 is conducted according to the same procedure as in Ex. 1 except that a phase shift film 14 (RuN film) containing Ru and N is formed on the protective film by using a reactive sputtering method. The deposition conditions for the phase shift film 14 are as follows.
(Deposition Conditions for RuN Film)
 Target: Ru target
 Sputtering gas: A mixed gas of Ar gas and N$_2$ (volume ratio of N$_2$ gas in the mixed gas (N$_2$/(Ar+N$_2$))=0.2, gas pressure: $2.0 \times 10$ Pa)
 Input power density per target area: 7.4 W/cm$^2$
 Deposition rate: 0.07 nm/sec
 Film thickness: 40 nm The composition ratio (at %) of the RuN film is Ru:N=99:1.

The half value width FWHM of a crystal peak derived from the phase shift film (RuN film) is 0.72°, and the crystal structure of the phase shift film (RuN film) is crystalline.

The phase difference in the EUV wavelength range and the relative reflectance are not measured.

The etching rate of the phase shift film (RuN film) is not measured.

Ex. 23

Ex. 23 is conducted according to the same procedure as in Ex. 1 except that a phase shift film 14 (RuReN film) containing Ru, Re and N is formed on the protective film by using a reactive sputtering method. The deposition conditions for the phase shift film 14 are as follows.
(Deposition Conditions for RuReN Film)
  Target: Ru target, Re target
  Sputtering gas: A mixed gas of Ar gas and $N_2$ (volume ratio of $N_2$ gas in the mixed gas ($N_2/(Ar+N_2)$)=0.04, gas pressure: $3.0\times10^{-1}$ Pa)
  Input power density per target area:
  Ru target: 7.4 W/cm$^2$
  Re target: 7.4 W/cm$^2$
  Deposition rate: 0.32 nm/sec
  Film thickness: 40 nm The composition ratio (at %) of the RuReN film is Ru:Re:N=41:58:1 (Ru+Re:N=99:1, Re/Ru=0.7).

The half value width FWHM of a crystal peak derived from the phase shift film (RuReN film) is 0.4°, and the crystal structure of the phase shift film (RuReN film) is crystalline.

The phase difference in the EUV wavelength range and the relative reflectance are not measured.

The etching rate of the phase shift film (RuReN film) is not measured.

Ex. 24

Ex. 24 is conducted according to the same procedure as in Ex. 1 except that a phase shift film 14 (RuCrN film) containing Ru, Cr and N is formed on the protective film by using a reactive sputtering method. The deposition conditions for the phase shift film 14 are as follows.
(Deposition Conditions for RuCrN Film)
  Target: Ru target, Cr target
  Sputtering gas: A mixed gas of Ar gas and $N_2$ (volume ratio of $N_2$ gas in the mixed gas ($N_2/(Ar+N_2)$)=0.09, gas pressure: $2.0\times10^{-1}$ Pa)
  Input power density per target area:
  Ru target: 7.4 W/cm$^2$
  Cr target: 7.4 W/cm$^2$
  Deposition rate: 0.24 nm/sec
  Film thickness: 40 nm The composition ratio (at %) of the RuCrN film is Ru:Cr:N=61:31:8.

The half value width FWHM of a crystal peak derived from the phase shift film (RuCrN film) is 0.52°, and the crystal structure of the phase shift film (RuCrN film) is crystalline.

The phase difference in the EUV wavelength range and the relative reflectance are not measured.

The etching rate of the phase shift film (RuCrN film) is not measured.

Reference Example

In Reference Example, a layer 1 ($RuO_x$ film or $RuO_xN$ film) of a phase shift film 14 containing Ru and O or containing Ru, O and N is formed on a Si wafer by using a reactive sputtering method. The deposition conditions for the layer 1 of the phase shift film 14 are as follows. The volume ratio of $O_2$ gas in the mixed gas is indicated with a range because a plurality of samples are manufactured under the conditions differing in the volume ratio of $O_2$ gas in the mixed gas.
(Deposition Conditions for $RuO_x$ Film)
  Target: Ru target
  Sputtering gas: A mixed gas of Ar gas and $O_2$ (volume ratio of $O_2$ gas in the mixed gas ($O_2/(Ar+O_2)$)=from 0.03 to 0.17, gas pressure: $2.0\times10^{-1}$ Pa)
  Input power density per target area: 7.4 W/cm$^2$
  Deposition rate: from 0.13 to 0.30 nm/sec Film thickness: 40 nm
(Deposition Conditions for $RuO_xN$ Film)
  Target: Ru target
  Sputtering gas: A mixed gas of Ar gas, $N_2$ and $O_2$ (volume ratio of $N_2$ gas in the mixed gas ($N_2/(Ar+O_2+N_2)$)=0.2, volume ratio of $O_2$ gas in the mixed gas ($O_2/(Ar+O_2+N_2)$)=from 0.026 to 0.17, gas pressure: $2.0\times10^{-1}$ Pa)
  Input power: 150 W
  Deposition rate: from 0.13 to 0.30 nm/sec
  Film thickness: 40 nm The surface roughness (RMS) of the phase shift film 14 ($RuO_x$ film, $RuO_xN$ film) surface is measured using an Atomic Force Microscope. The surface roughness (RMS) can be also measured based on JIS-B0601-2001.

Figure 8:
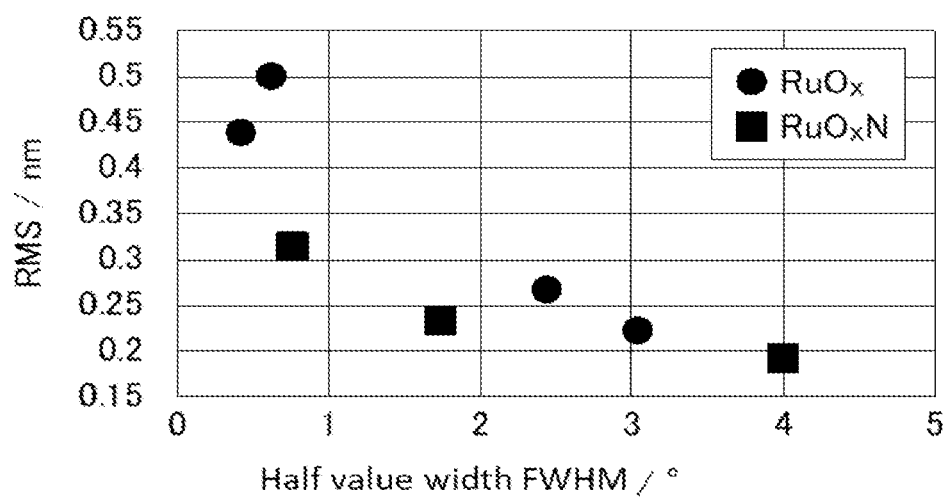
FIG. 8 is a diagram illustrating a relationship between the half value width FWHM and the surface roughness RMS of the phase shift film in Reference Example.

FIG. 8 is a diagram illustrating a relationship between the half value width FWHM (°) and the surface roughness RMS (nm) of the phase shift film in Reference Example.

As seen from FIG. 8, in both the $RuO_x$ film and the $RuO_xN$ film, when the half value width FWHM of the phase shift film 14 is 1.0° or more, the surface roughness (RMS) of the phase shift film 14 surface is 0.3 nm or less.

While the present invention has been described in detail and with reference to specific embodiments thereof, it will be apparent to one skilled in the art that various changes and modifications can be made therein without departing from the spirit and scope thereof.

This application is based on Japanese Patent Application No. 2020-127311 filed on Jul. 28, 2020, the entire subject matters of which are incorporated herein by reference.

1a, 1b: EUV Mask blank
2: EUV Mask
11: Substrate
12: Multilayer reflective film
13: Protective film
14: Phase shift film
15: Etching mask film
30: Resist film
140: Phase shift film pattern
150: Etching mask film pattern
300: Resist pattern

The invention claimed is:
1. A reflective mask blank for EUV lithography, comprising: a substrate;
  a multilayer reflective film for reflecting EUV light; and
  a phase shift film for shifting a phase of EUV light, the multilayer reflective film and the phase shift film formed on or above the substrate in this order,
  wherein the phase shift film comprises a layer 1 comprising ruthenium (Ru) and at least one selected from the group consisting of oxygen (O) and nitrogen (N), and
  wherein among diffraction peaks derived from the phase shift film observed at 2θ: from 20° to 50° by out-of-plane XRD method, a peak having the highest intensity has a half value width FWHM of 1.0° or more.
2. The reflective mask blank for EUV lithography according to claim 1,
  wherein the layer 1 comprises from 40 to 99 at % of Ru and from 1 to 60 at % of O, or comprises from 30 to 98 at % of Ru, from 1 to 69 at % of O, and from 1 to 69 at % of N.
3. The reflective mask blank for EUV lithography according to claim 1,
  wherein the layer 1 comprises from 30 to 98 at % of Ru and from 2 to 70 at % of N.

4. The reflective mask blank for EUV lithography according to claim 2,
wherein the layer 1 further comprises at least one element (X) selected from the group consisting of chromium (Cr), tantalum (Ta), titanium (Ti), rhenium (Re), tungsten (W), bismuth (Bi), manganese (Mn), platinum (Pt), copper (Cu), iridium (Ir), and vanadium (V) in a range of 20:1 to 1:5 in terms of a composition ratio (at %) (Ru:X) of Ru to X, and
wherein the layer 1 comprises from 40 to 99 at % of a total (Ru+X) of Ru and X and from 1 to 60 at % of O, or comprises 30 to 98 at % of a total (Ru+X) of Ru and X, from 1 to 69 at % of O, and from 1 to 69 at % of N.

5. The reflective mask blank for EUV lithography according to claim 3,
wherein the layer 1 further comprises at least one element (X) selected from the group consisting of Cr, Ta, Ti, Re, W, Bi, Mn, Pt, Cu, Ir, and V in a range of 20:1 to 1:5 in terms of a composition ratio (at %) (Ru:X) of Ru to X, and
wherein the layer 1 comprises from 30 to 90 at % of a total (Ru+X) of Ru and X and from 10 to 70 at % of N.

6. The reflective mask blank for EUV lithography according to claim 1,
wherein the phase shift film further comprises a layer 2 comprising at least one element (X) selected from the group consisting of Cr, Ta, Ti, Re, W, Bi, Mn, Pt, Cu, Ir, and V.

7. The reflective mask blank for EUV lithography according to claim 6,
wherein the layer 2 further comprises at least one element selected from the group consisting of O, N, boron (B), and carbon (C).

8. The reflective mask blank for EUV lithography according to claim 1,
wherein the phase shift film has a thickness of from 20 nm to 60 nm.

9. The reflective mask blank for EUV lithography according to claim 1,
wherein the layer 1 has a thickness of 10 nm or more.

10. The reflective mask blank for EUV lithography according to claim 1,
wherein a phase difference between a reflected light of EUV light from the multilayer reflective film and a reflected light of EUV light from the phase shift film is from 150° to 250°, and
wherein a relative reflectance between an EUV light ray reflectance on a surface of the phase shift film and an EUV light ray reflectance on a surface of the multilayer reflective film ((EUV light ray reflectance on phase shift film surface/EUV light ray reflectance on multilayer reflective film surface)×100) is from 2% to 37%.

11. The reflective mask blank for EUV lithography according to claim 1, comprising a protective film for the multilayer reflective film formed between the multilayer reflective film and the phase shift film.

12. The reflective mask blank for EUV lithography according to claim 11,
wherein the protective film comprises at least one element selected from the group consisting of Ru, palladium (Pd), Ir, rhodium (Rh), Pt, zirconium (Zr), niobium (Nb), Ta, Ti, and silicon (Si).

13. The reflective mask blank for EUV lithography according to claim 12,
wherein the protective film further comprises at least one element selected from the group consisting of O, N, and B.

14. The reflective mask blank for EUV lithography according to claim 1, comprising an etching mask film on the phase shift film,
wherein the etching mask film comprises at least one element selected from the group consisting of Nb, Ti, molybdenum (Mo), Ta, and Si.

15. The reflective mask blank for EUV lithography according to claim 14,
wherein the etching mask film further comprises at least one element selected from the group consisting of O, N, and B.

16. A reflective mask for EUV lithography, obtained by forming a pattern in the phase shift film of the reflective mask blank for EUV lithography according to claim 1.

17. A method for manufacturing a reflective mask blank for EUV lithography, comprising:
forming, on a substrate, a multilayer reflective film for reflecting EUV light;
forming, on the multilayer reflective film, a phase shift film for shifting a phase of EUV light; and
forming an etching mask film on the phase shift film,
wherein the phase shift film comprises a layer 1 comprising ruthenium (Ru) and at least one selected from the group consisting of oxygen (O) and nitrogen (N),
wherein among diffraction peaks derived from the phase shift film observed at 2θ: from 20° to 50° by out-of-plane XRD method, a peak having a highest intensity has a half value width FWHM of 1.0° or more, and
wherein the etching mask film is removable by cleaning with an acid or a base.

18. A method for manufacturing a reflective mask for EUV lithography, comprising forming a pattern by patterning the phase shift film in the reflective mask blank for EUV lithography manufactured by the manufacturing method of a reflective mask blank for EUV lithography according to claim 17.

* * * * *